(12) United States Patent
Okumura et al.

(10) Patent No.: US 10,141,399 B2
(45) Date of Patent: Nov. 27, 2018

(54) SEMICONDUCTOR DEVICE

(71) Applicant: Kabushiki Kaisha Toshiba, Minato-ku, Tokyo (JP)

(72) Inventors: Hideki Okumura, Nonoichi Ishikawa (JP); Masanobu Tsuchitani, Kanazawa Ishikawa (JP); Hiroto Misawa, Nomi Ishikawa (JP); Akira Ezaki, Nonoichi Ishikawa (JP); Tatsuya Shiraishi, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/846,916

(22) Filed: Sep. 7, 2015

(65) Prior Publication Data
US 2016/0276430 A1 Sep. 22, 2016

(30) Foreign Application Priority Data
Mar. 16, 2015 (JP) ................. 2015-051579

(51) Int. Cl.
*H01L 29/207* (2006.01)
*H01L 29/06* (2006.01)
(Continued)

(52) U.S. Cl.
CPC ........ *H01L 29/0649* (2013.01); *H01L 29/402* (2013.01); *H01L 29/66136* (2013.01); *H01L 29/7397* (2013.01); *H01L 29/7811* (2013.01); *H01L 29/7813* (2013.01); *H01L 29/8613* (2013.01); *H01L 29/0661* (2013.01); *H01L 29/1045* (2013.01); *H01L 29/1095* (2013.01); *H01L 29/42376* (2013.01)

(58) Field of Classification Search
CPC ......... H01L 21/76224; H01L 21/76237; H01L 21/76245; H01L 21/76264
USPC .................. 257/93, 374, 446, 501, 522, 725
See application file for complete search history.

(56) References Cited

U.S. PATENT DOCUMENTS 6,589,853 B2   7/2003   Kumamoto
7,781,310 B2   8/2010   Grivna
(Continued)

FOREIGN PATENT DOCUMENTS

JP   H04-171765 A   6/1992
JP   H06-140633 A   5/1994
(Continued)

OTHER PUBLICATIONS

Tomonori Komachi et al., "A 1.7 mm-Square 3.2kV Low Leakage Current Si MOSFET", IEEE, Electron Devices Meeting, 2006.

*Primary Examiner* — Tan N Tran
(74) *Attorney, Agent, or Firm* — White & Case LLP

(57) ABSTRACT

According to an embodiment, a semiconductor device includes a first semiconductor region of a first conductivity type, a second semiconductor region of a second conductivity type, a first insulating layer, and a first insulating region. The second semiconductor region is provided on the first semiconductor region. The first insulating layer is provided around at least a portion of the first semiconductor region and at least a portion of the second semiconductor region. The first insulating layer contacts the second semiconductor region. The first insulating region is provided around at least a portion of the first insulating layer.

20 Claims, 29 Drawing Sheets

(51) Int. Cl.
*H01L 29/78* (2006.01)
*H01L 29/739* (2006.01)
*H01L 29/40* (2006.01)
*H01L 29/66* (2006.01)
*H01L 29/861* (2006.01)
*H01L 29/10* (2006.01)
*H01L 29/423* (2006.01)

(56) References Cited

U.S. PATENT DOCUMENTS

| | | | | |
|---|---|---|---|---|
| 7,956,423 | B2* | 6/2011 | Arai | H01L 21/823437 |
| | | | | 257/367 |
| 8,445,385 | B2* | 5/2013 | Schricker | H01L 21/31138 |
| | | | | 257/E21.215 |
| 8,692,352 | B2* | 4/2014 | Onishi | H01L 21/764 |
| | | | | 257/397 |
| 2009/0189257 | A1 | 7/2009 | Seki et al. | |
| 2010/0044839 | A1 | 2/2010 | Okada et al. | |
| 2013/0069109 | A1 | 3/2013 | Matsuda et al. | |
| 2013/0087854 | A1 | 4/2013 | Miwatashi | |
| 2016/0163800 | A1 | 6/2016 | Sakai | |

FOREIGN PATENT DOCUMENTS

| | | |
|---|---|---|
| JP | 2000-332099 A | 11/2000 |
| JP | 2005-136064 A | 5/2005 |
| JP | 2009-206502 A | 9/2009 |
| JP | 2012-09489 A | 1/2012 |
| JP | 2013-080893 A | 5/2013 |
| JP | 2013-254793 A | 12/2013 |
| JP | 2015-019014 A | 1/2015 |
| WO | 2008-044801 A | 2/2008 |

* cited by examiner

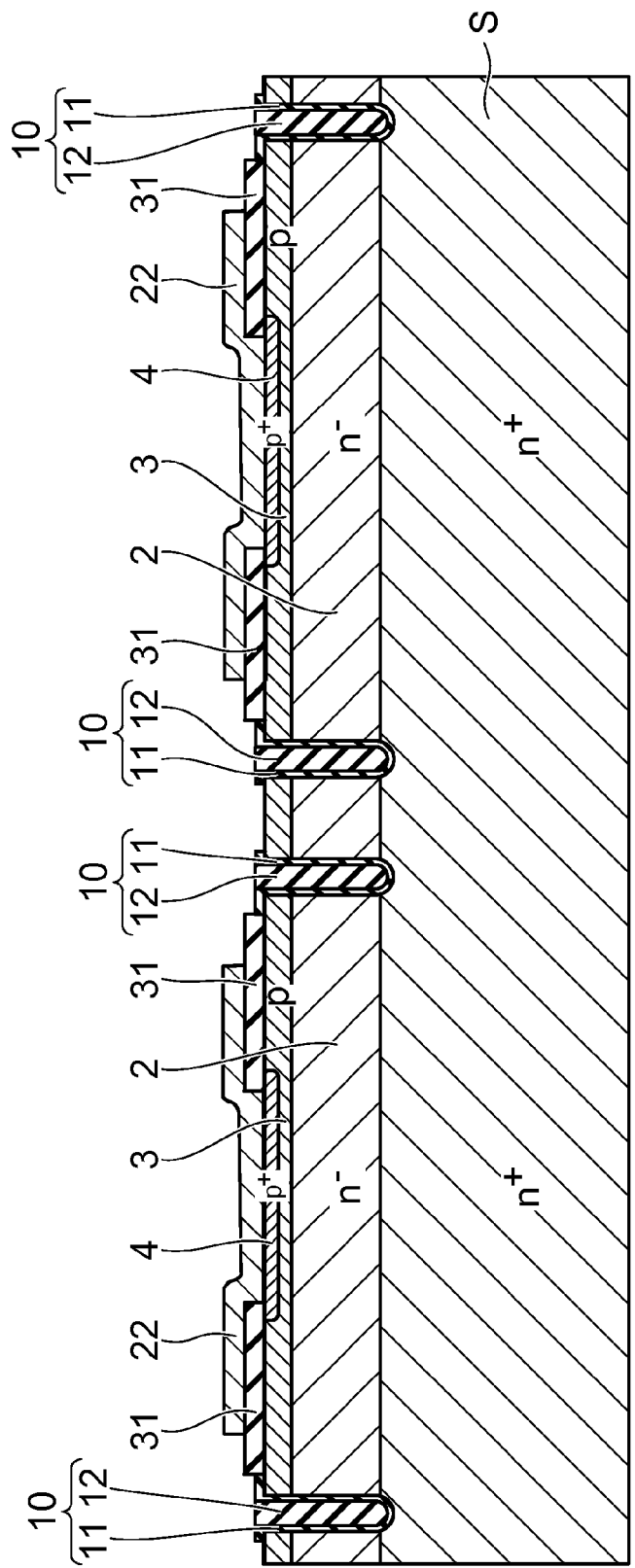
FIG. 11
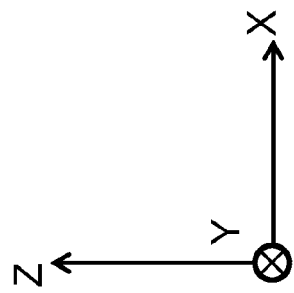

SEMICONDUCTOR DEVICE

CROSS-REFERENCE TO RELATED APPLICATIONS

This application is based upon and claims the benefit of priority from Japanese Patent Application No. 2015-051579, filed on Mar. 16, 2015; the entire contents of which are incorporated herein by reference.

FIELD

Embodiments described herein relate generally to a semiconductor device.

BACKGROUND

For example, semiconductor devices such as diodes, MOSFETs (Metal Oxide Semiconductor Field Effect Transistors), IGBTs (Insulated Gate Bipolar Transistors), etc., are used in power conversion circuits, etc. In these semiconductor devices, for example, a p-type semiconductor region is formed on a portion of an n$^-$-type semiconductor region; and the breakdown voltage is obtained by a depletion layer spreading from the p-n junction surface into the n$^-$-type semiconductor region.

However, in the case where the p-type semiconductor region is formed on the portion of the n$^-$-type semiconductor region, the p-n junction surface includes a bent portion. The electric field concentrates at the bent portion of the p-n junction surface. Therefore, the breakdown voltage of the semiconductor device undesirably decreases due to the electric field concentration at the bend.

Accordingly, technology that can suppress the decrease of the breakdown voltage of the semiconductor device is desirable.

BRIEF DESCRIPTION OF THE DRAWINGS

FIG. 7 to FIG. 11 are cross-sectional views of processes, showing the manufacturing processes of the semiconductor device 100 according to the first embodiment;

DETAILED DESCRIPTION

Figure 1:
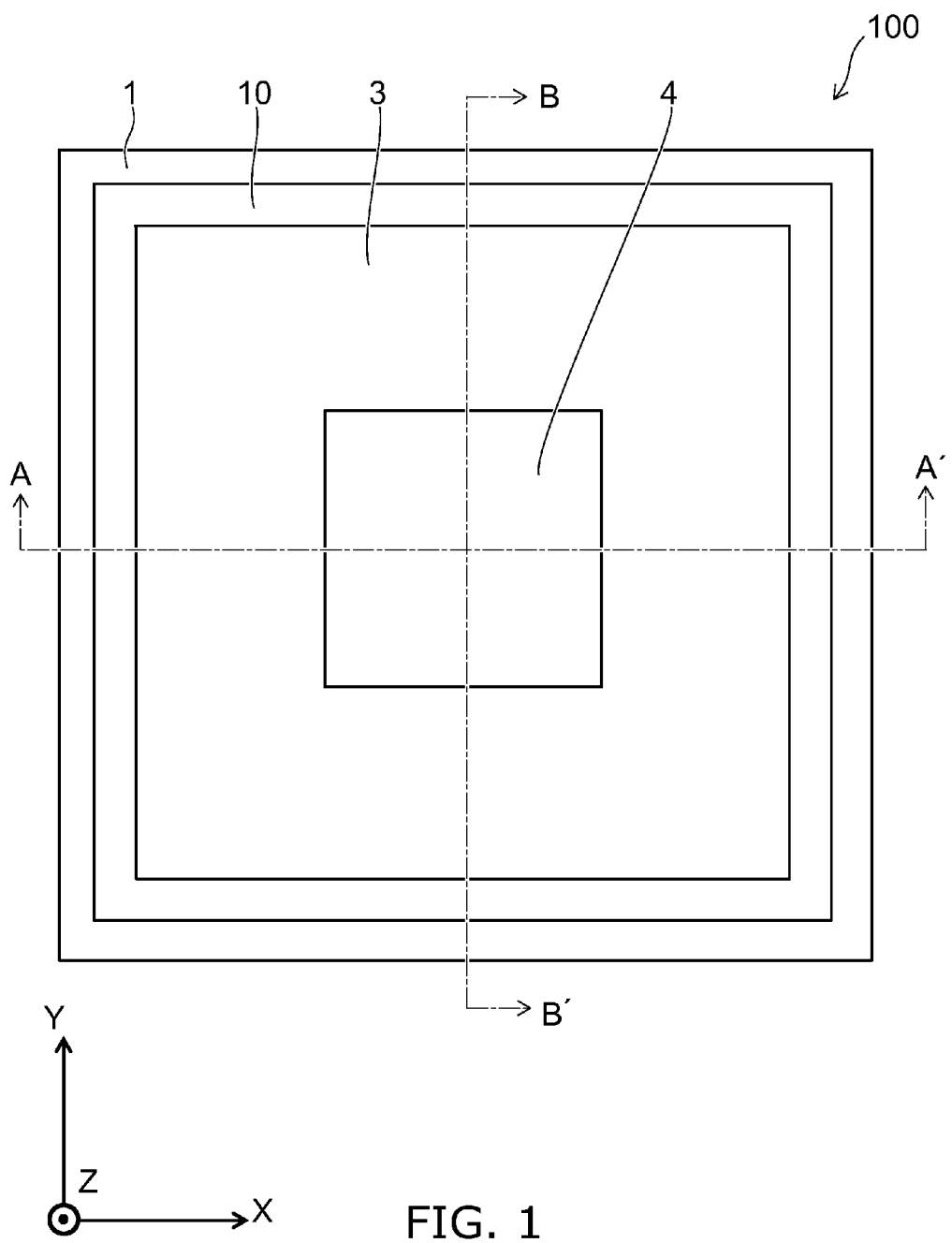
FIG. 1 is a plan view of a semiconductor device according to a first embodiment.

According to an embodiment, a semiconductor device includes a first semiconductor region of a first conductivity type, a second semiconductor region of a second conductivity type, a first insulating layer, and a first insulating region. The second semiconductor region is provided on the first semiconductor region. The first insulating layer surrounds at least a portion of the first semiconductor region and at least a portion of the second semiconductor region. The first insulating layer contacts the second semiconductor region. The first insulating region surrounds at least a portion of the first insulating layer.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments. For example, two mutually-orthogonal directions parallel to a major surface of a substrate used when making the semiconductor devices according to the embodiments are taken as an X-direction (a second direction) and a Y-direction. A direction orthogonal to both the X-direction and the Y-direction is taken as a Z-direction (a first direction).

In the description of the embodiments, the notations of n$^+$, n, n$^-$, p$^+$, p, and p$^-$ indicate relative levels of the impurity concentrations of the conductivity types. In other words, n$^+$ indicates that the n-type impurity concentration is relatively higher than that of n; and n$^-$ indicates that the n-type impurity concentration is relatively lower than that of n. p$^+$ indicates that the p-type impurity concentration is relatively higher than that of p; and p$^-$ indicates that the p-type impurity concentration is relatively lower than that of p.

The embodiments described below may be implemented by reversing the p-type and the n-type of the semiconductor regions.

First Embodiment

FIG. 1 is a plan view of a semiconductor device 100 according to a first embodiment.

Figure 2:
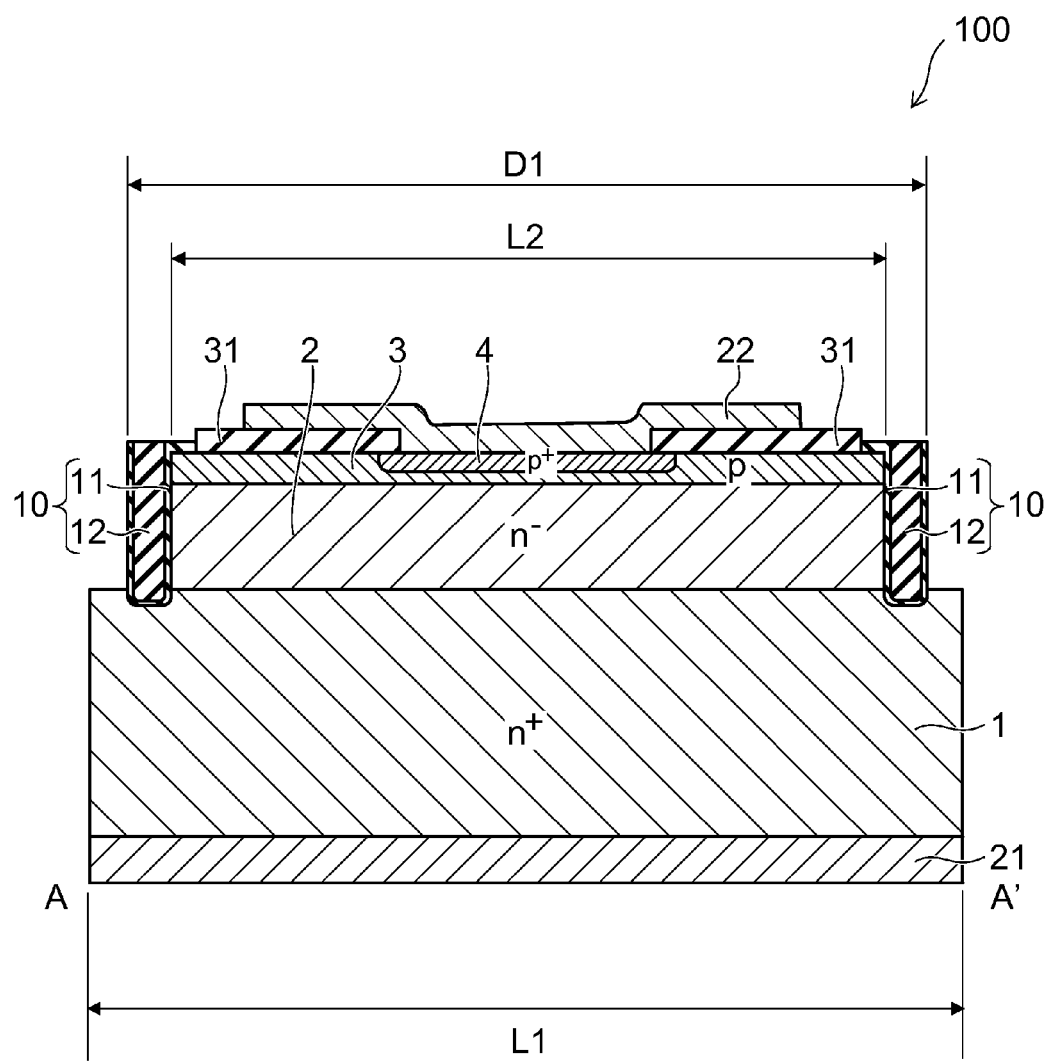
FIG. 2 is an A-A' cross-sectional view of FIG. 1.
Figure 2:
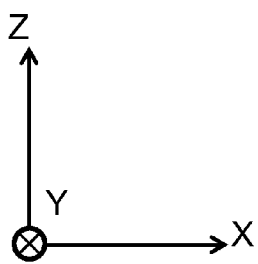

FIG. 2 is an A-A' cross-sectional view of FIG. 1.

Figure 3:
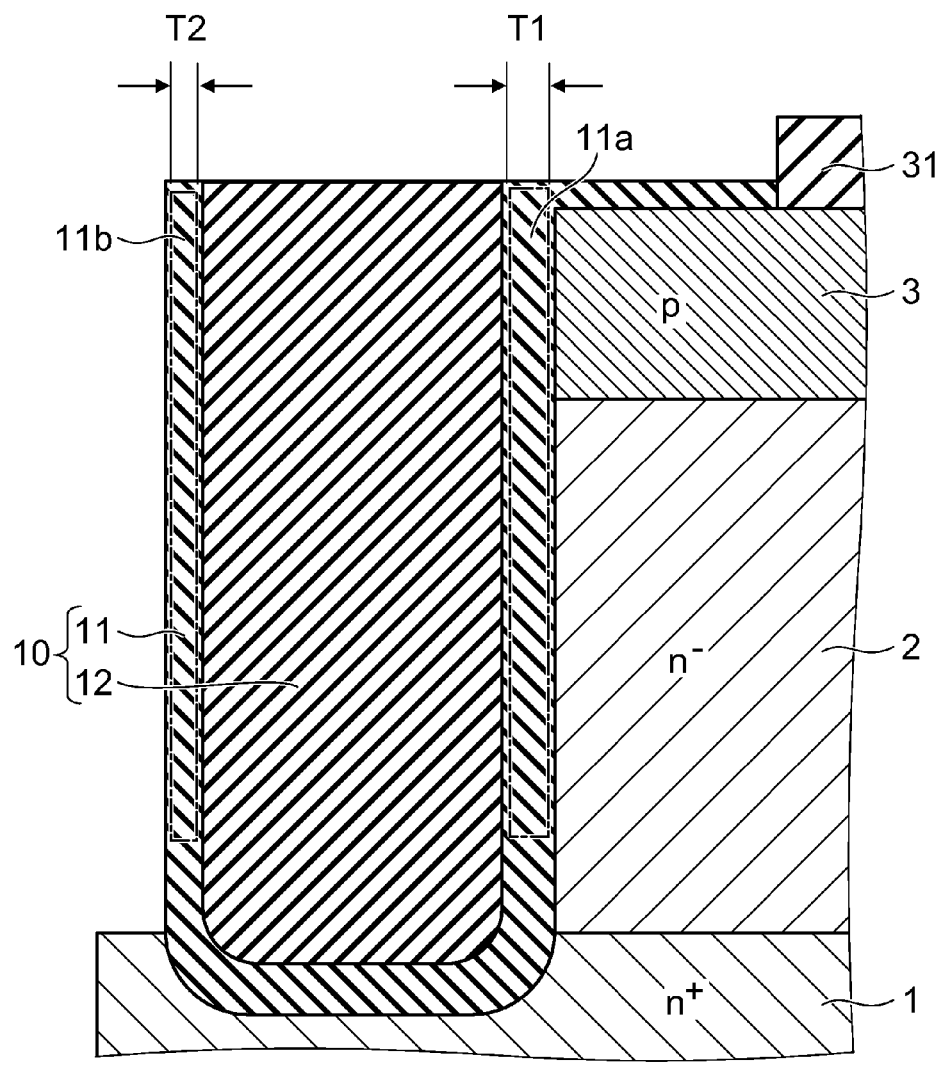
FIG. 3 is a cross-sectional view in which a portion of FIG. 2 is enlarged.

FIG. 3 is a cross-sectional view in which a portion of FIG. 2 is enlarged.

An insulating layer 31, an anode electrode 22, and a portion of an insulating unit 10 are not shown in FIG. 1.

The semiconductor device 100 is, for example, a diode.

The semiconductor device 100 includes an n$^+$-type semiconductor region 1 (a third semiconductor region of a first conductivity type), an n$^-$-type semiconductor region 2 (a first semiconductor region), a p-type semiconductor region 3 (a second semiconductor region of a second conductivity type), a p$^+$-type semiconductor region 4 (a fifth semiconductor region), a first insulating layer 11, a first insulating region 12, a cathode electrode 21, the anode electrode 22, and the insulating layer 31.

As shown in FIG. 1, the p-type semiconductor region 3 is provided around the p$^+$-type semiconductor region 4. The insulating unit 10 is provided around the p-type semiconductor region 3. A portion of the n$^+$-type semiconductor region 1 is provided around the insulating unit 10 when the semiconductor device 100 is viewed from the Z-direction.

The outer edge of the semiconductor device 100 (the outer edge of the n$^+$-type semiconductor region 1) is a quadrilateral as shown in FIG. 1. However, the outer edge is not limited to the example; and the outer edge of the semiconductor device 100 may be a circle or a quadrilateral having corners having small curvatures.

As shown in FIG. 2, the cathode electrode 21 is electrically connected to the n$^+$-type semiconductor region 1. For example, the n$^-$-type semiconductor region 2 is provided on a portion of the n$^+$-type semiconductor region 1. Accordingly, a length L1 in the X-direction of the n$^+$-type semiconductor region 1 is longer than a length L2 in the X-direction of the n$^-$-type semiconductor region 2.

The p-type semiconductor region 3 is provided on the n$^-$-type semiconductor region 2. The p$^+$-type semiconductor region 4 is selectively provided on the p-type semiconductor region 3. The p$^+$-type semiconductor region 4 may be provided on the entire surface of the p-type semiconductor region 3.

The insulating unit 10 is provided on another portion of the n$^+$-type semiconductor region 1. For example, the insulating unit 10 is provided around the p-type semiconductor region 3, the n$^-$-type semiconductor region 2, and a portion of the n$^+$-type semiconductor region 1 along the X-Y plane that is orthogonal to the direction (the Z-direction) from the n$^-$-type semiconductor region 2 toward the p-type semiconductor region 3. In other words, the insulating unit 10 surrounds the p-type semiconductor region 3, the n$^-$-type semiconductor region 2, and the portion of the n$^+$-type semiconductor region 1 along the X-Y plane.

For example, the –Z direction end portion of the insulating unit 10 reaches the n$^+$-type semiconductor region 1. A portion of the insulating unit 10 is provided around a portion of the n$^+$-type semiconductor region 1 along the X-Y plane. However, a portion of the n$^-$-type semiconductor region 2 may be provided between the n$^+$-type semiconductor region 1 and the –Z direction end portion of the insulating unit 10.

The insulating layer 31 is provided on the p-type semiconductor region 3. The anode electrode 22 is provided on the p$^+$-type semiconductor region 4 and on the insulating layer 31. A portion of the p-type semiconductor region 3 opposes the anode electrode 22 in the Z-direction with the insulating layer 31 interposed. As shown in FIG. 2, a portion of the insulating unit 10 may be provided on the p-type semiconductor region 3.

For example, the structure of the semiconductor device 100 of the B-B' cross-sectional view of FIG. 1 is the same structure as that of the A-A' cross-sectional view shown in FIG. 2.

As shown in FIG. 2 and FIG. 3, the insulating unit 10 includes the first insulating layer 11 and the first insulating region 12. For example, the first insulating layer 11 contacts the n$^+$-type semiconductor region 1, the n$^-$-type semiconductor region 2, and the p-type semiconductor region 3. The first insulating layer 11 is provided around the p-type semiconductor region 3, the n$^-$-type semiconductor region 2, and a portion of the n$^+$-type semiconductor region 1 along the X-Y plane. The first insulating layer 11 may be provided around only a portion of the n$^-$-type semiconductor region 2 and a portion of the p-type semiconductor region 3.

The first insulating region 12 is provided around a portion of the first insulating layer 11, at least a portion of the n$^-$-type semiconductor region 2, and at least a portion of the p-type semiconductor region 3 along the X-Y plane. The first insulating region 12 may be further provided around a portion of the n$^+$-type semiconductor region 1.

For example, as shown in FIG. 2, the length L1 in the X-direction of the n$^+$-type semiconductor region 1 is longer than a distance D1 from one X-direction end of the first insulating layer 11 to the other X-direction end of the first insulating layer 11.

The first insulating layer 11 includes, for example, a first portion 11a and a second portion 11b. For example, the first portion 11a and the second portion 11b are aligned with the Z-direction. The second portion 11b is separated from the first portion 11a in the direction from the p-type semiconductor region 3 toward the first insulating layer 11.

Hereinbelow, the direction from the p-type semiconductor region 3 toward the first insulating layer 11 is called a fourth direction. The fourth direction is, for example, a direction along the X-Y plane.

The first portion 11a contacts the n$^-$-type semiconductor region 2 and the p-type semiconductor region 3. The first portion 11a may further contact the n$^+$-type semiconductor region 1. The second portion 11b is provided around at least a portion of the first portion 11a along the X-Y plane. The first insulating region 12 is provided between the first portion 11a and the second portion 11b.

For example, a thickness T1 in the fourth direction of the first portion 11a is thicker than a thickness T2 in the fourth direction of the second portion 11b. However, the thickness T1 may be thinner than the thickness T2; and the thicknesses T1 and T2 may be equal.

To reduce the effects on the breakdown voltage of impurities, etc., adhered to the outer wall of the insulating unit 10, it is desirable for the thickness in the fourth direction of the insulating unit 10 including the first insulating layer 11 and the first insulating region 12 to be set to 1 µm or more. Also, because the size of the semiconductor device 100 undesirably increases in the case where the insulating unit 10 is thick, it is desirable for the thickness in the fourth direction of the insulating unit 10 to be not less than 1 µm and not more than 200 µm.

Although FIG. 3 is an enlargement of the insulating unit 10 vicinity of the A-A' cross-sectional view of FIG. 1, for example, the configuration of the insulating unit 10 vicinity of the B-B' cross-sectional view of FIG. 1 is similar to FIG. 3.

An example of the method for manufacturing the semiconductor device 100 will now be described with reference to FIG. 4 to FIG. 14.

Figure 4:
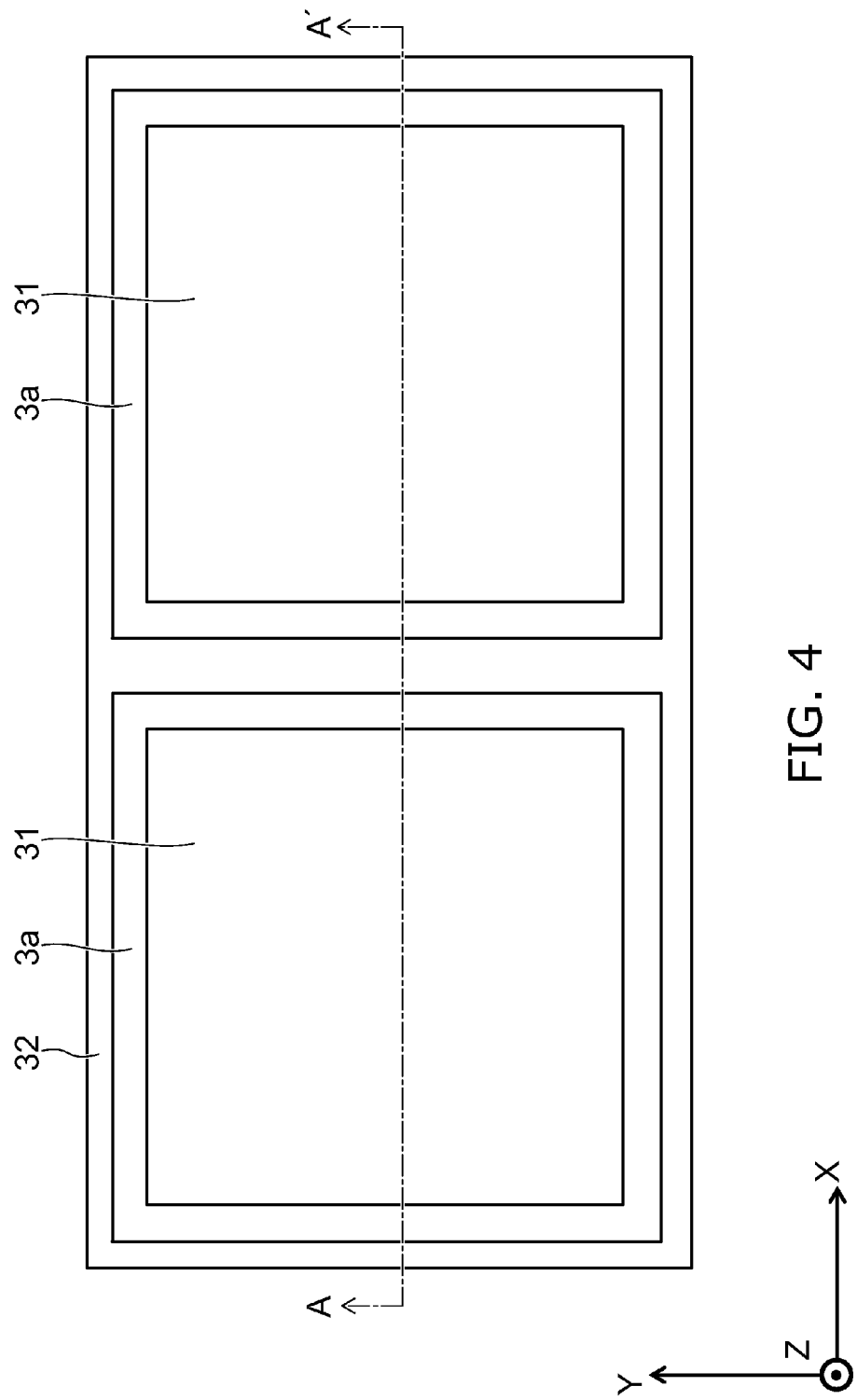
FIG. 4 is a process plan view showing the manufacturing process of the semiconductor device according to the first embodiment.
Figure 6:
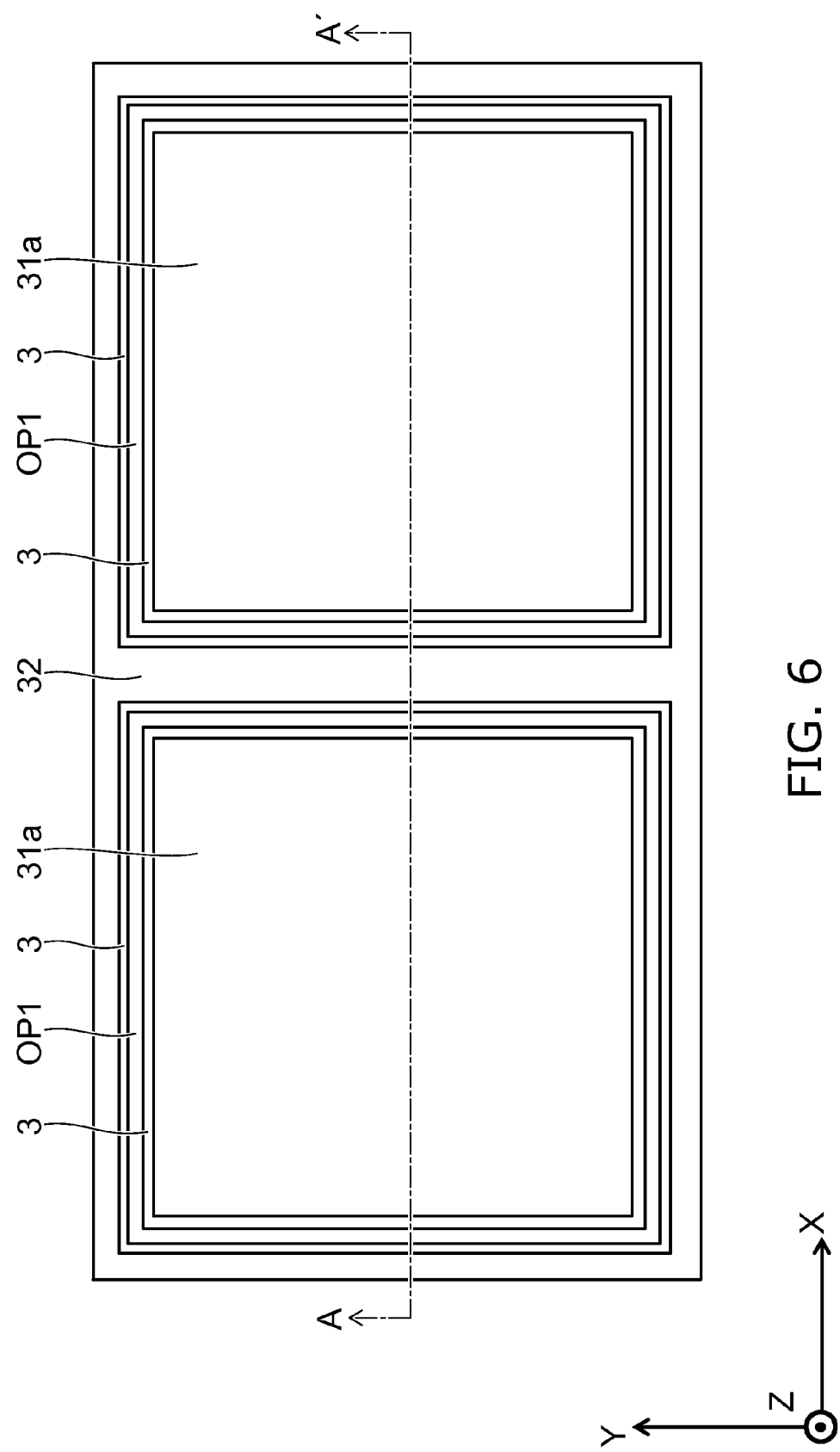
FIG. 6 is a process plan view showing the manufacturing process of the semiconductor device according to the first embodiment.
Figure 12:
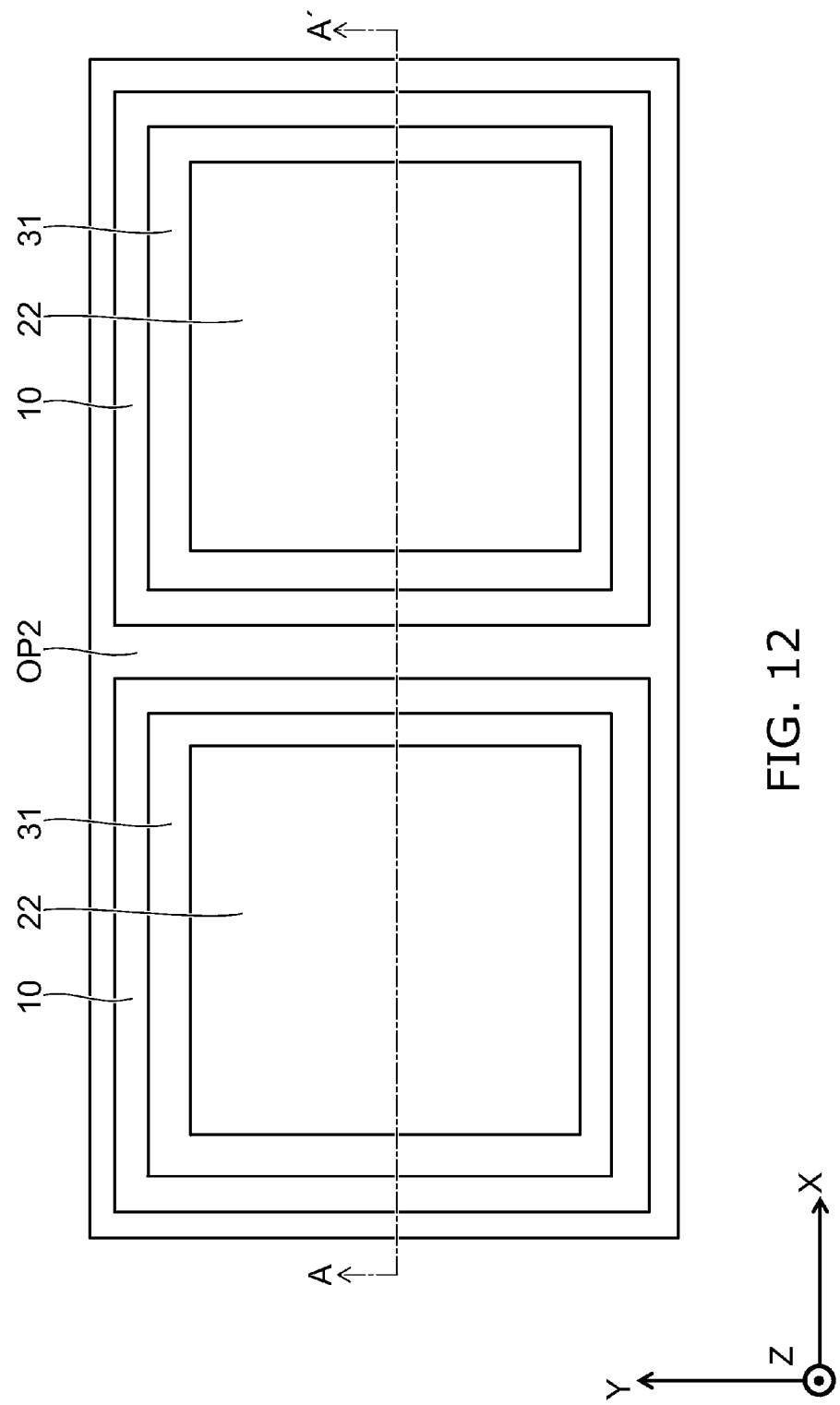
FIG. 12 is a process plan view showing the manufacturing process of the semiconductor device according to the first embodiment.

FIG. 4, FIG. 6, and FIG. 12 are process plan views showing the manufacturing processes of the semiconductor device 100 according to the first embodiment.

FIG. 5, FIG. 7 to FIG. 11, FIG. 13, and FIG. 14 are cross-sectional views of processes, showing the manufacturing processes of the semiconductor device 100 according to the first embodiment.

Figure 5:
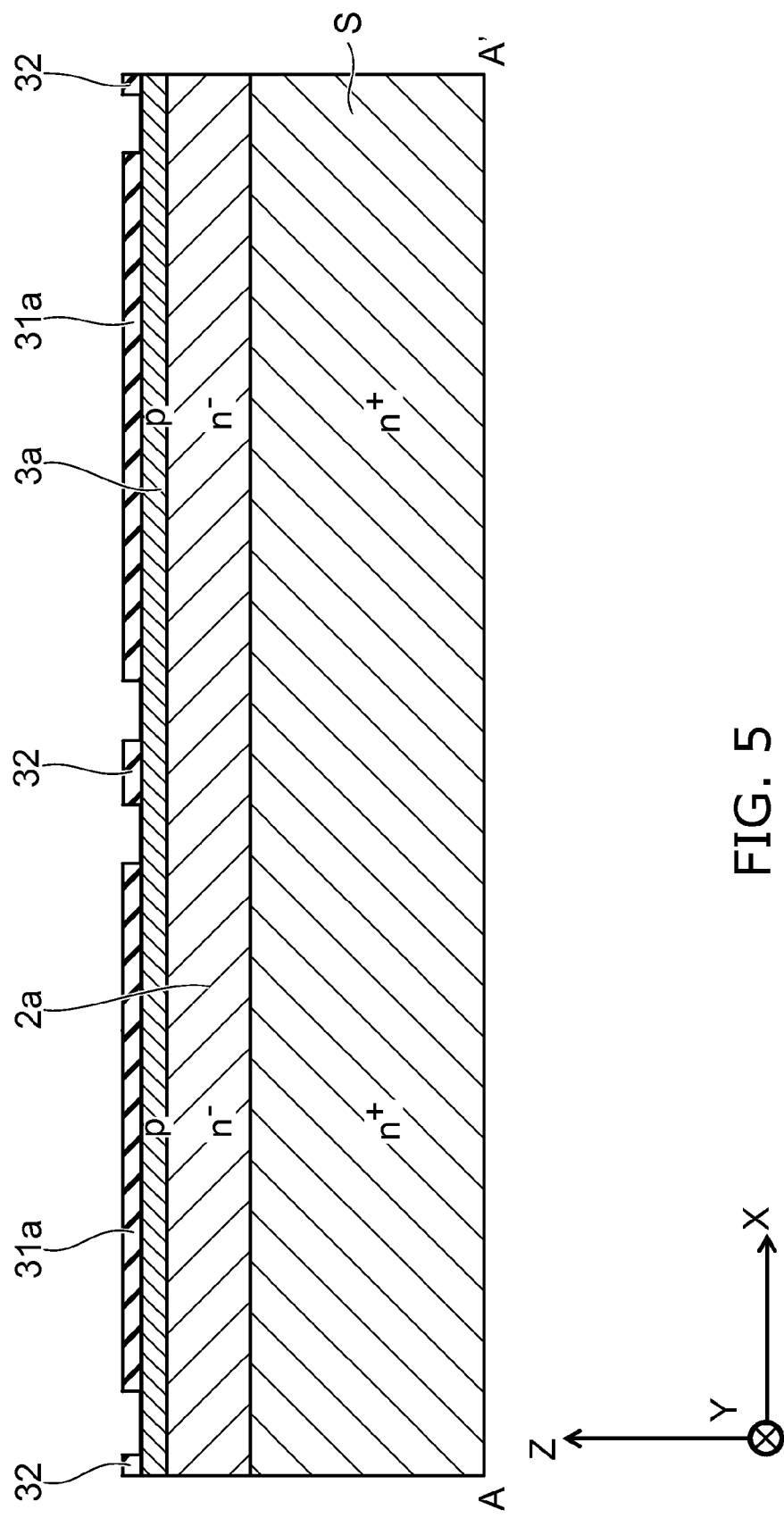
FIG. 5 is a cross-sectional view of process, showing the manufacturing process of the semiconductor device according to the first embodiment.
Figure 7:
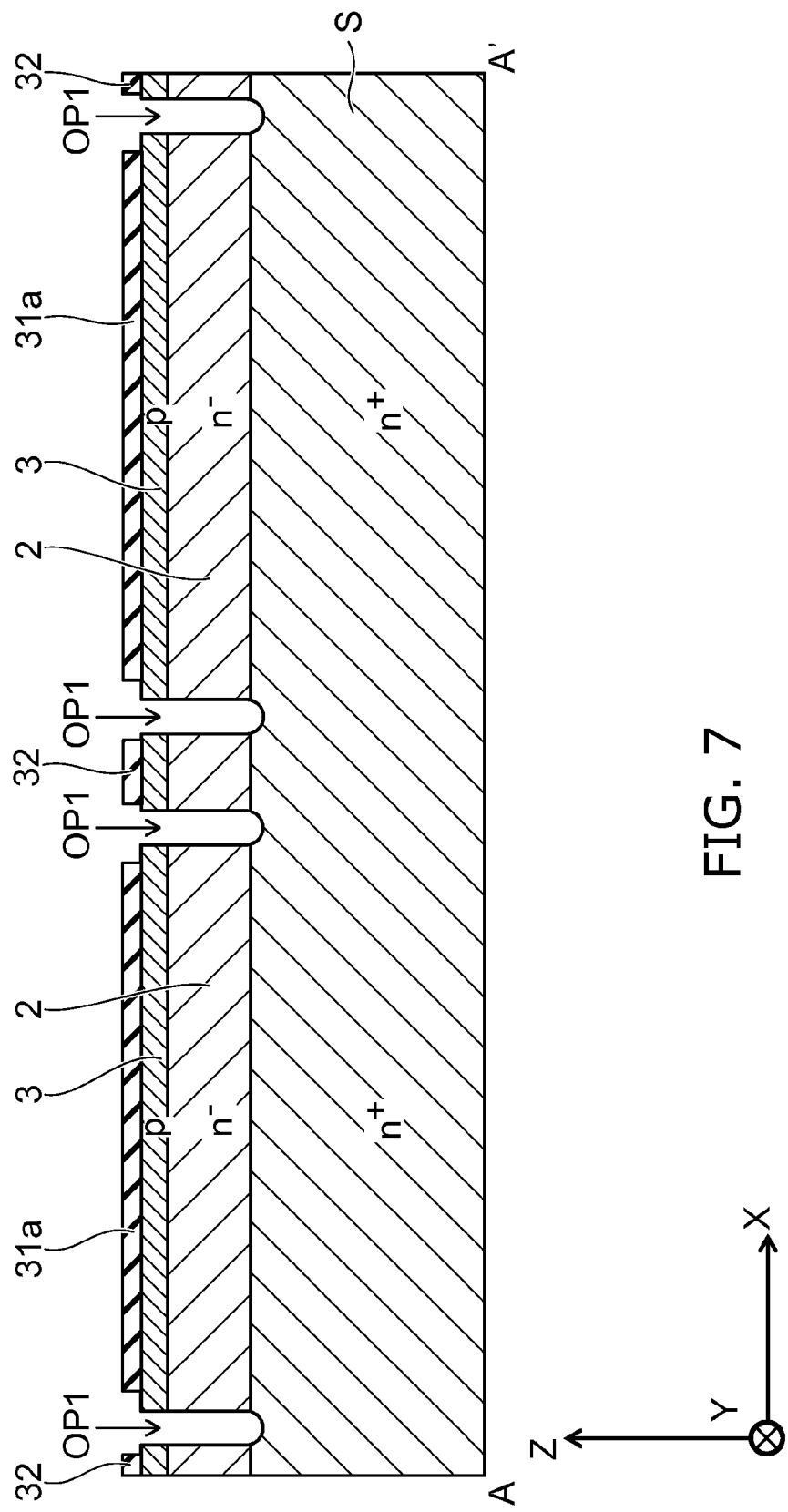
Figure 13:
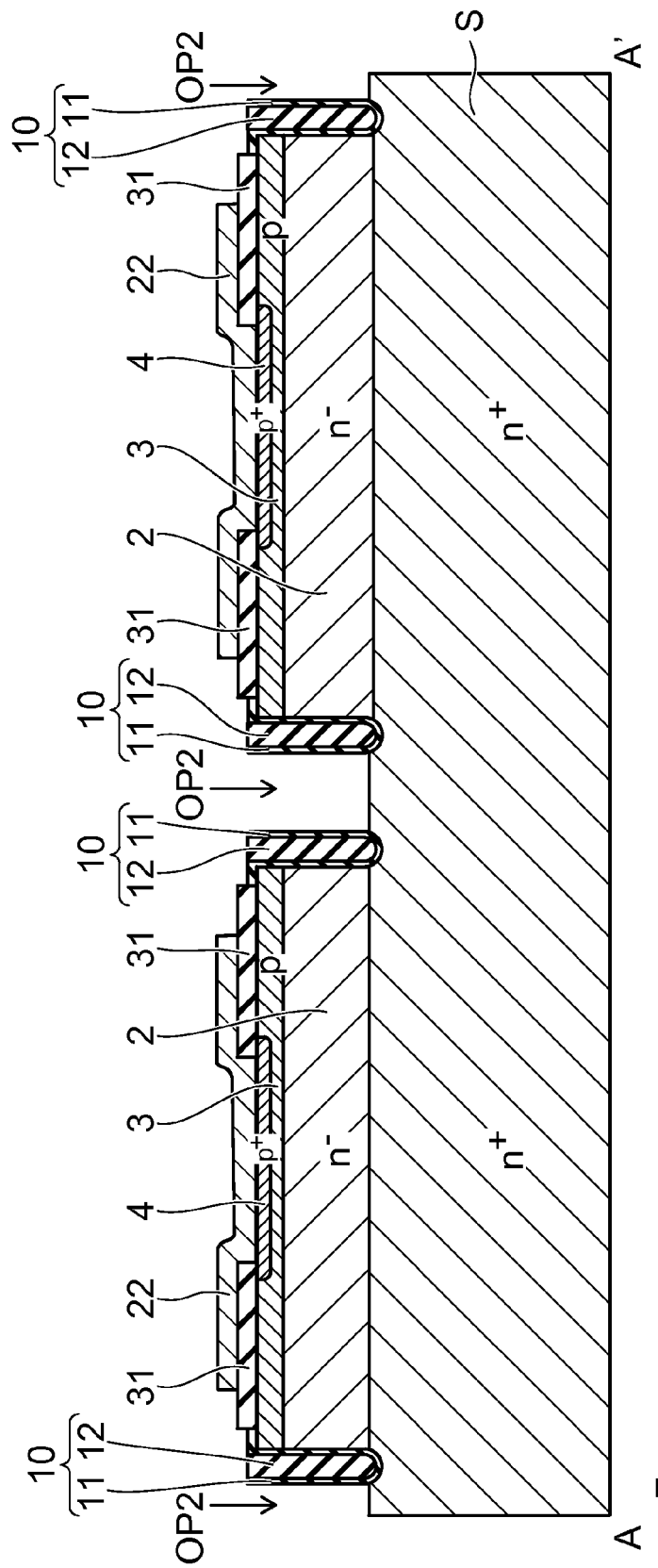
FIG. 13, and FIG. 14 are cross-sectional views of processes, showing the manufacturing processes of the semiconductor device 100 according to the first embodiment.

FIG. 5 is an A-A' cross section of FIG. 4. FIG. 7 is an A-A' cross section of FIG. 6. FIG. 13 is an A-A' cross section of FIG. 12.

FIG. 8 to FIG. 11 and FIG. 14 are cross-sectional views at positions corresponding to the positions marked by lines A-A' in FIG. 4, FIG. 6, and FIG. 12.

First, an $n^+$-type semiconductor substrate S (hereinbelow, called the substrate S) is prepared. A major component of the substrate S is, for example, silicon (Si). The major component of the substrate S may be gallium arsenide, silicon carbide, gallium nitride, etc. A region of a portion of the substrate S corresponds to the $n^+$-type semiconductor region 1 shown in FIG. 1 to FIG. 3.

In the description hereinbelow, the case is described where the major component of the substrate S is Si.

An $n^-$-type semiconductor layer 2a and a p-type semiconductor layer 3a are formed on the substrate S. For example, the $n^-$-type semiconductor layer 2a is formed by performing epitaxial growth of Si while adding an n-type impurity. For example, the p-type semiconductor layer 3a is formed by performing epitaxial growth of Si while adding a p-type impurity. For example, phosphorus or arsenic may be used as the n-type impurity. For example, boron may be used as the p-type impurity.

Then, an insulating layer is formed on the p-type semiconductor layer 3a. Continuing, an insulating layer 31a and an insulating layer 32 are formed by patterning the insulating layer. The configuration at this time is shown in FIG. 4 and FIG. 5.

Then, as shown in FIG. 6 and FIG. 7, an opening OP1 is made in the $n^-$-type semiconductor layer 2a and the p-type semiconductor layer 3a. As shown in FIG. 6 and FIG. 7, the opening OP1 may reach the substrate S. By this process, for example, the $n^-$-type semiconductor layer 2a and the p-type semiconductor layer 3a are divided; and the $n^-$-type semiconductor region 2 and the p-type semiconductor region 3 shown in FIG. 1 to FIG. 3 are obtained.

For example, the opening OP1 is made using photolithography and RIE (Reactive Ion Etching). As shown in FIG. 6, the opening OP1 is made in an annular configuration. The configuration and width of the opening OP1 are not limited to the example shown in FIG. 6 and FIG. 7 and are modifiable as appropriate according to the configuration and width of the final insulating unit 10 to be formed.

For example, a fluorocarbon-based gas such as $CF_4$, etc., or a sulfur fluoride-based gas such as $SF_6$, etc., may be used as the etching gas when making the opening OP1.

Figure 8:
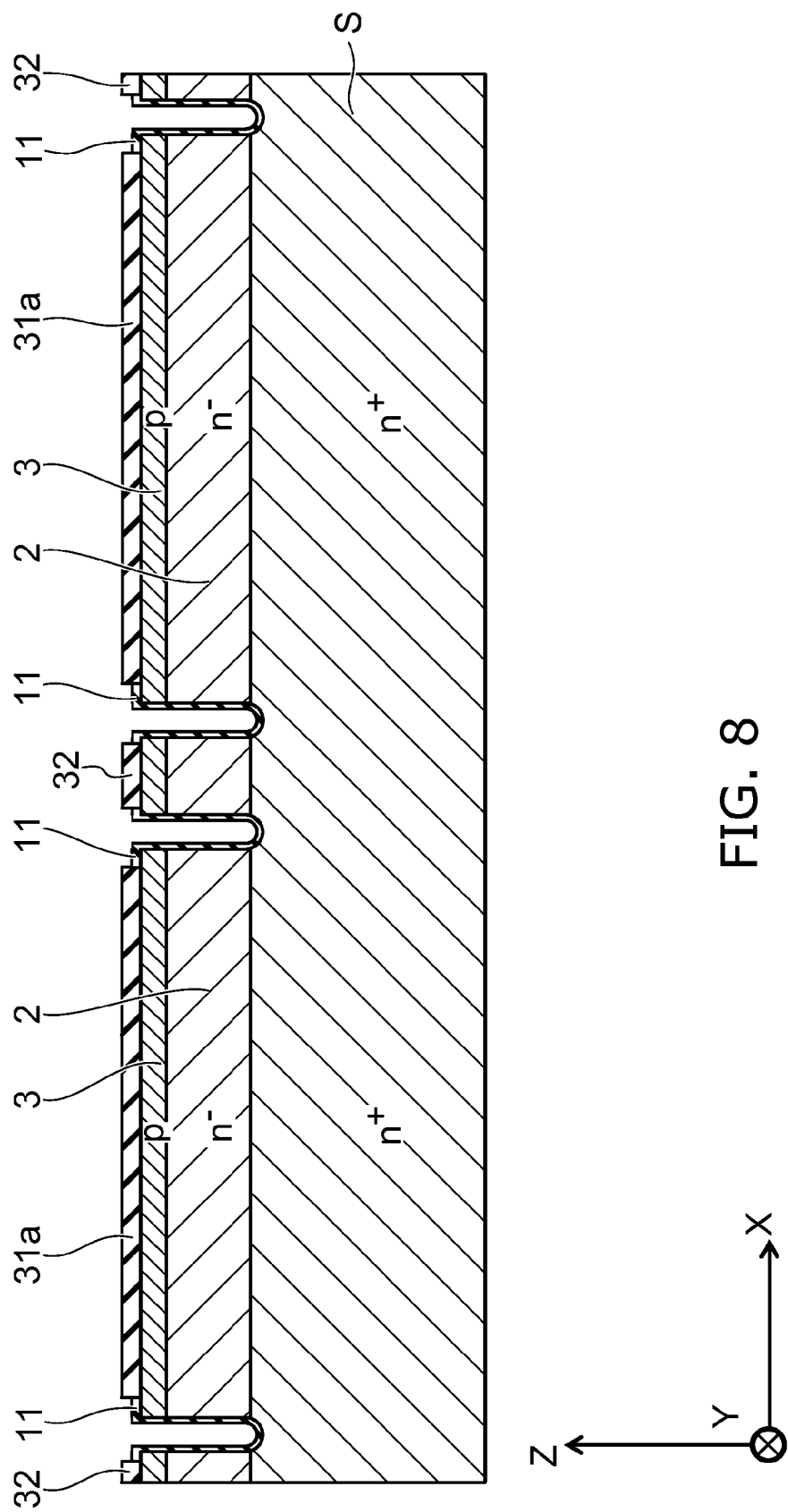

Then, by performing thermal oxidation, the first insulating layer 11 which is an oxide film is formed on the inner wall of the opening OP1 as shown in FIG. 8. By this process, the dangling bonds of the Si exposed at the inner wall of the opening OP1 are terminated. Simultaneously, the thermal oxidation at this time also may form the first insulating layer 11 on the portion of the upper surface of the p-type semiconductor region 3 not covered with the insulating layer 31a.

Prior to performing the thermal oxidation, the portions damaged by the RIE may be removed by performing CDE (Chemical Dry Etching), we etching, etc. By removing the damaged portions, the amount of Si having dangling bonds can be reduced even further.

Figure 9:
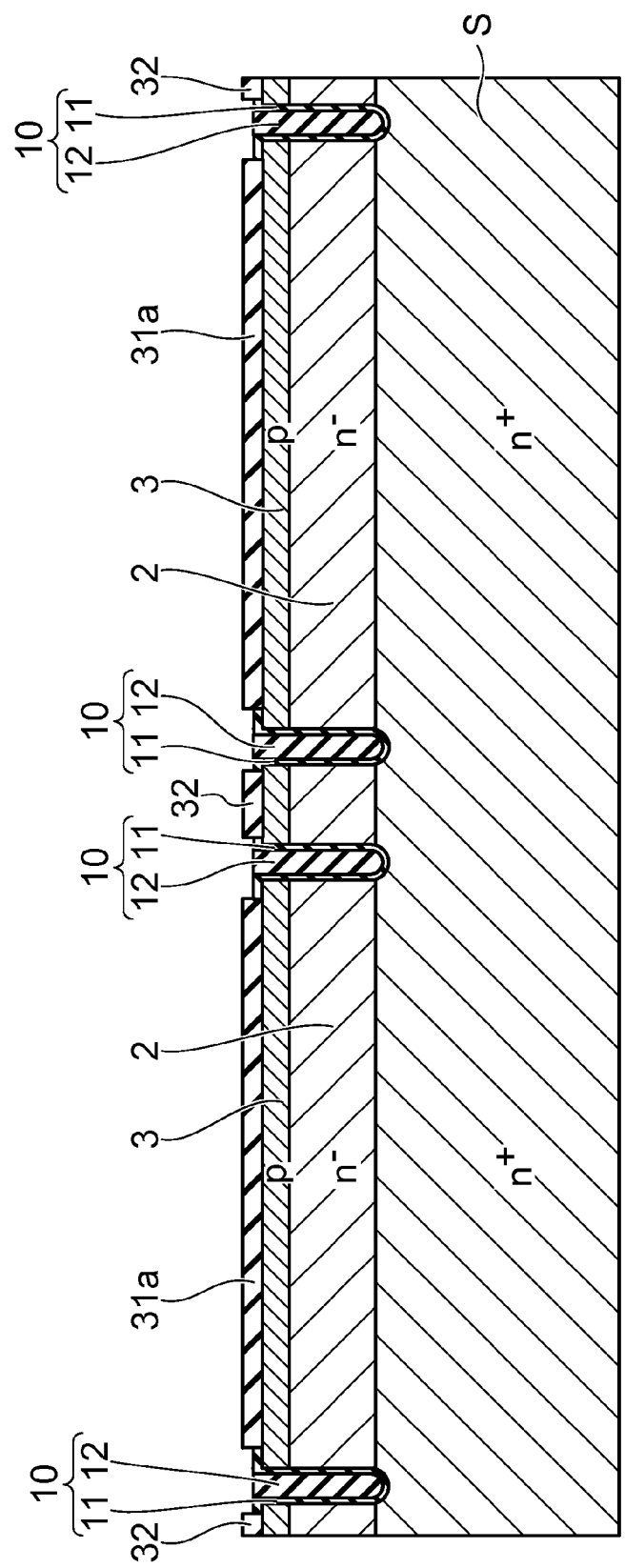

Then, as shown in FIG. 9, an insulating material is filled into the interior of the opening OP1 where the first insulating layer 11 is formed. At this time, the insulating material is deposited on the insulating layer 31a as well. For example, the insulating material that is deposited on the insulating layer 31a is removed by CMP (Chemical Mechanical Polishing). By these processes, as shown in FIG. 9, the first insulating region 12 that is provided in the interior of the opening OP1 is formed.

Figure 10:
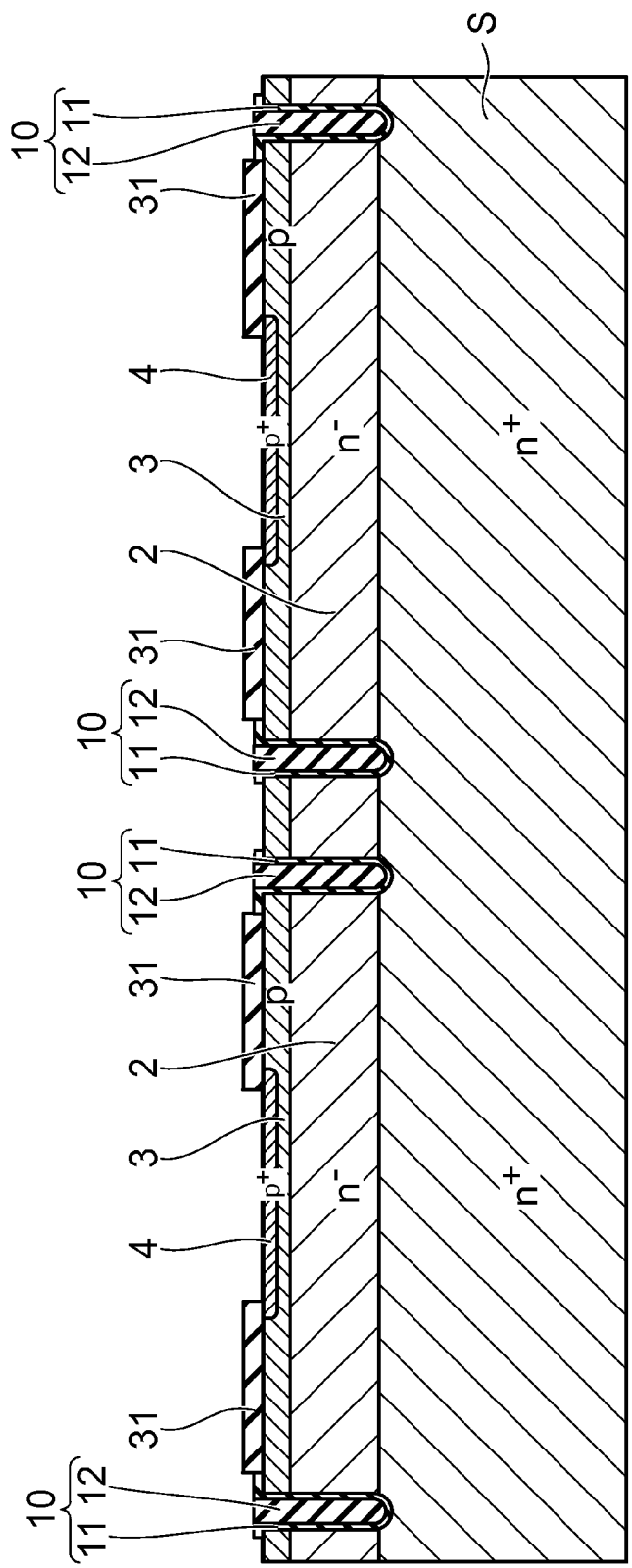

Continuing, a portion of the insulating layer 31a is removed to expose a portion of the p-type semiconductor region 3. At this time, simultaneously, the insulating layer 32 is removed. Continuing, the $p^+$-type semiconductor region 4 is formed as shown in FIG. 10 by performing ion implantation of a p-type impurity in the state in which the regions other than the region where the p-type semiconductor region 3 is exposed are covered with a not-shown mask.

Then, a metal layer is formed on the $p^+$-type semiconductor region 4. By patterning the metal layer, the anode electrode 22 is formed as shown in FIG. 11.

Continuing, a not-shown mask is formed to cover the insulating layer 31, the anode electrode 22, and at least a portion of the insulating unit 10. Continuing, the portions of the $n^-$-type semiconductor layer 2a and the p-type semiconductor layer 3a other than the $n^-$-type semiconductor region 2 and the p-type semiconductor region 3 partitioned by the multiple openings OP1 are removed by RIE using the mask. By this process, an opening OP2 is made around the insulating unit 10 as shown in FIG. 12 and FIG. 13.

In the case where residue of the etching, etc., adheres to the inner wall of the opening OP2, there are cases where the distribution of the potential in the interior of the semiconductor device is affected by the residue; and the breakdown voltage decreases. Accordingly, after making the opening OP2, for example, it is desirable to remove the residue adhered to the side wall of the opening OP2 by performing isotropic etching such as CDE, etc.

Or, the opening OP2 may be made using a Bosch process. The Bosch process is a method in which an etching process and a protective film formation process are repeatedly performed. Specifically, first, etching of the Si is performed using a not-shown mask. For example, a sulfur fluoride gas such as $SF_6$, etc., is used for the etching. Then, a protective film is formed using a fluorocarbon gas such as $C_4F_8$, etc. Continuing, the protective film that is deposited on the regions not covered with the mask is removed; and etching of the Si is performed. Continuing, the formation of the protective film is performed again. The opening OP2 is made by repeating these processes.

The etching process of the Bosch process includes isotropic etching. Therefore, the residue that is adhered to the side wall of the opening OP2 after the opening OP2 is made can be reduced by making the opening OP2 using the Bosch process.

Or, the opening OP2 may be made by we etching. In such a case, an alkaline solution such as potassium hydroxide (KOH), etc., may be used as the etchant.

When making the opening OP2, the first insulating layer 11 of the insulating unit 10 may function as a mask that protects the first insulating region 12. Accordingly, it is desirable for the etching gas used when making the opening OP2 to be able to selectively remove the n⁻-type semiconductor region 2 and the p-type semiconductor region 3 compared to the first insulating layer 11. For example, similarly to when making the opening OP1, a fluorocarbon-based gas such as $CF_4$, etc., or a sulfur fluoride-based gas such as $SF_6$, etc., may be used as the etching gas.

When making the opening OP2, the second portion 11b of the first insulating layer 11 is exposed to the etching gas; but the first portion 11a of the first insulating layer 11 that contacts the p-type semiconductor region 3 is not exposed to the etching gas. Therefore, in the state after making the opening OP2, the thickness in the fourth direction of the first portion 11a may be thicker than the thickness in the fourth direction of the second portion 11b.

Figure 14:
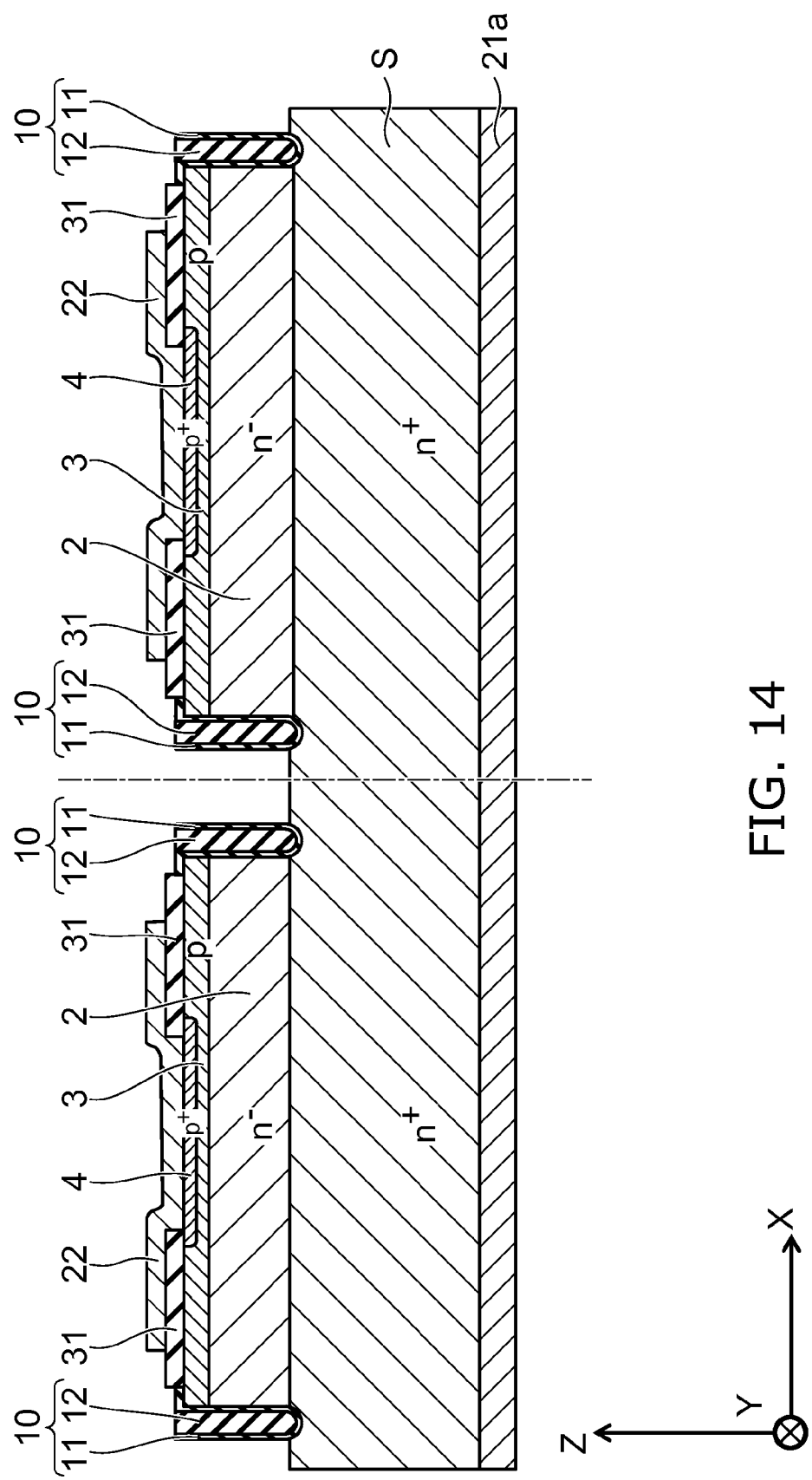

Then, the back surface of the substrate S is polished until the substrate S has a prescribed thickness. Continuing as shown in FIG. 14, a cathode electrode 21a is formed on the back surface of the substrate S. Subsequently, the semiconductor device 100 shown in FIG. 1 to FIG. 3 is obtained by performing dicing at the position illustrated by the broken line of FIG. 14 to divide the substrate S and the cathode electrode 21a.

Mechanical dicing using a blade, laser dicing, plasma dicing using RIE technology, etc., may be used as the dicing method.

The operations and effects of the embodiment will now be described.

According to the embodiment, it is possible to suppress the decrease of the breakdown voltage of the semiconductor device.

This reason will now be described in detail.

First, as a comparative example, a semiconductor device will be described in which the p-type semiconductor region 3 is provided on a portion of the n⁻-type semiconductor region 2, and a portion of the p-n junction surface between the n⁻-type semiconductor region 2 and the p-type semiconductor region 3 is bent. In the semiconductor device according to the comparative example, the electric field concentrates at the portion where the p-n junction surface is bent. Therefore, the breakdown voltage of the semiconductor device undesirably decreases due to the concentration of the electric field at the bend.

Conversely, the distribution of the potential of the semiconductor device 100 according to the embodiment will now be described with reference to FIG. 15.

Figure 15:
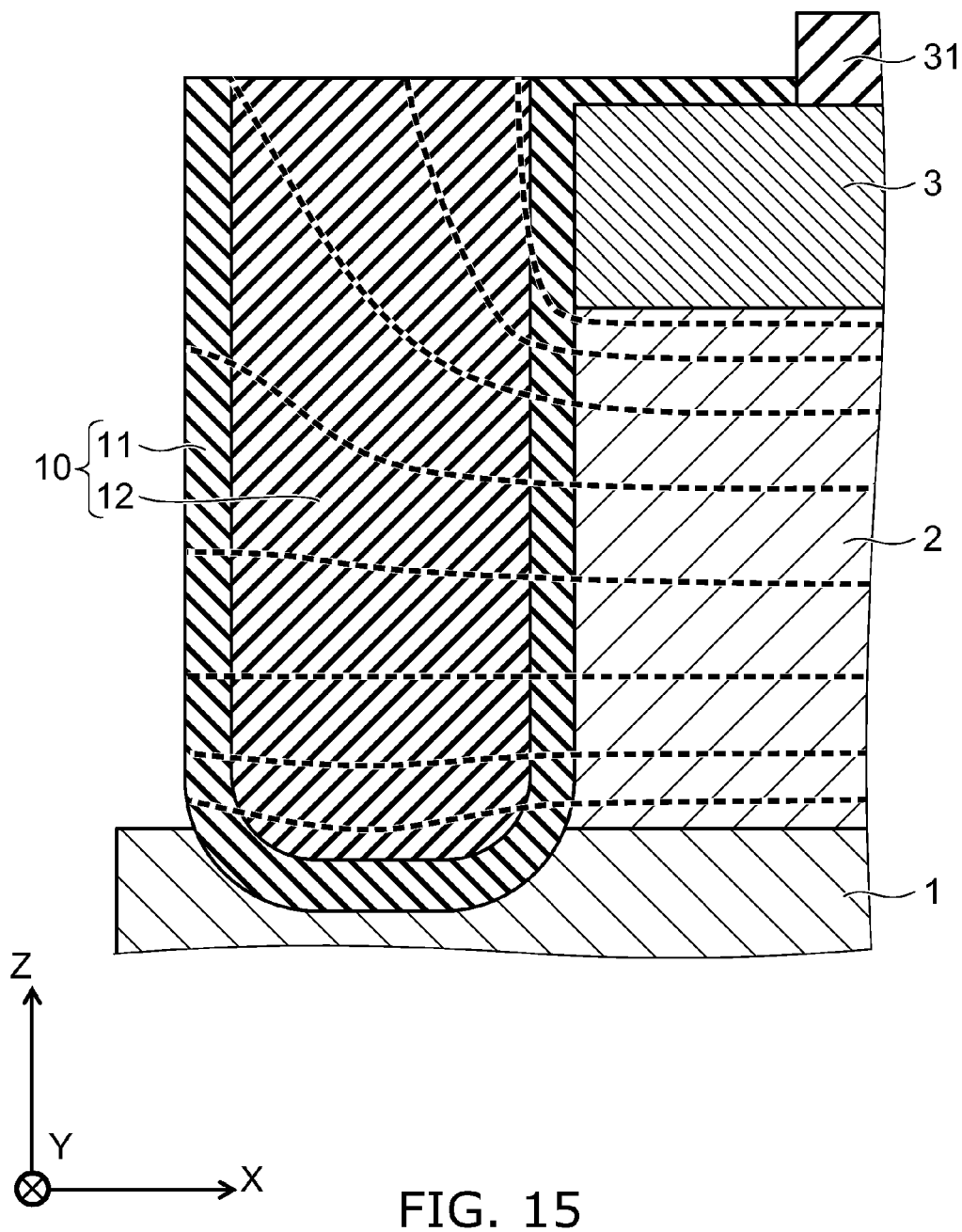
FIG. 15 is an enlarged cross-sectional view showing a characteristic of the semiconductor device according to the first embodiment.

FIG. 15 is an enlarged cross-sectional view showing a characteristic of the semiconductor device 100 according to the first embodiment.

The broken lines of FIG. 15 schematically illustrate equipotential lines in the state in which a voltage that is positive with respect to the cathode electrode 21 is applied to the anode electrode 22.

As shown in FIG. 15, the equipotential lines spread along the p-n junction surface of the n⁻-type semiconductor region 2 and the p-type semiconductor region 3. In the embodiment, the p-n junction surface does not include a bent portion because the p-type semiconductor region 3 contacts the first insulating layer 11.

Therefore, as shown in FIG. 15, the equipotential lines that spread along the p-n junction surface intersect the contact surface of the first insulating layer 11 and the n⁻-type semiconductor region 2 and are substantially perpendicular to the contact surface of the first insulating layer 11 and the n⁻-type semiconductor region 2. As a result, the local concentration of the electric field at a portion of the p-n junction surface is suppressed; and it is possible to suppress the decrease of the breakdown voltage of the semiconductor device.

According to the embodiment, it is unnecessary to provide a terminal region around the p-type semiconductor region 3 because the first insulating layer 11 and the first insulating region 12 are provided in contact with the p-type semiconductor region 3. Accordingly, according to the embodiment, it is possible to suppress the decrease of the breakdown voltage of the semiconductor device and downsize the semiconductor device.

The p-type semiconductor region 3 is provided on the entire surface of the n⁻-type semiconductor region 2. By employing such a configuration, compared to the case where the n⁻-type semiconductor region 2 is provided around the p-type semiconductor region 3, it is possible to reduce the strength of the electric field generated between the n⁻-type semiconductor region 2 and the anode electrode 22.

Therefore, according to the embodiment, it is unnecessary to provide a thick inter-layer insulating film between the n⁻-type semiconductor region 2 and the anode electrode 22; and it is possible to downsize the semiconductor device and improve the productivity of the semiconductor device.

Further, in the embodiment, for example, in addition to the first insulating layer 11 formed by oxidation treatment, the first insulating region 12 is provided around at least a portion of the first insulating layer 11. Thereby, it is possible to reduce the effects on the breakdown voltage of the semiconductor device due to the impurities adhered around the first insulating region 12.

Second Embodiment

Figure 16:
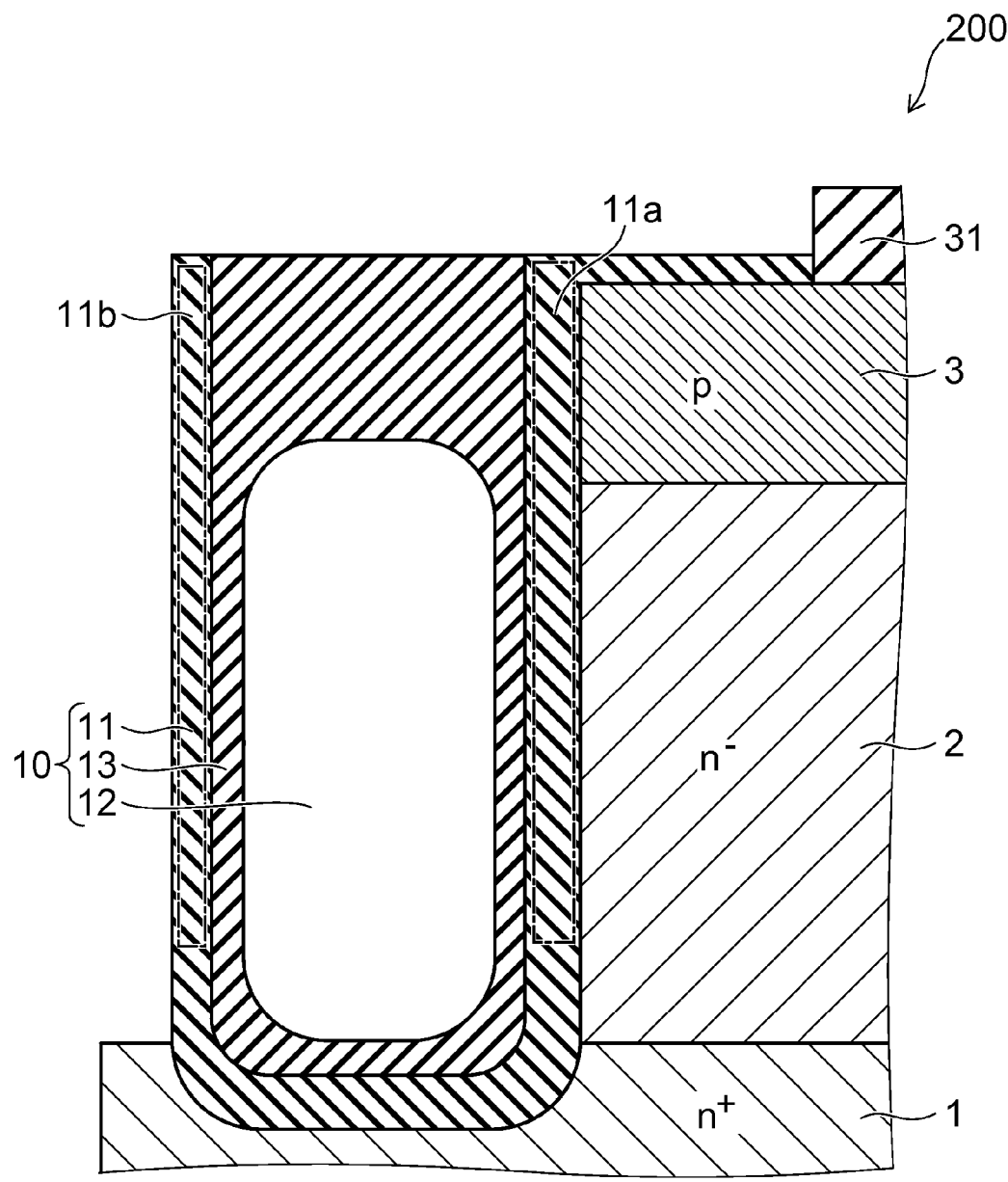
FIG. 16 is a cross-sectional view in which a portion of a semiconductor device according to a second embodiment is enlarged.

FIG. 16 is a cross-sectional view in which a portion of a semiconductor device 200 according to a second embodiment is enlarged.

FIG. 16 is an enlargement of a portion of the X-Z cross section of the semiconductor device 200; and the structure of the Y-Z cross section of the semiconductor device 200 is, for example, the same as the structure shown in FIG. 16.

Compared to the semiconductor device 100, for example, the structure of the insulating unit 10 of the semiconductor device 200 is different. Other than the insulating unit 10, a structure similar to that of the semiconductor device 100 is employable as the structure of the semiconductor device 200.

As shown in FIG. 16, the insulating unit 10 includes the first insulating layer 11, the first insulating region 12, and a second insulating region 13. Similarly to the first embodiment, the first insulating layer 11 includes the first portion 11a and the second portion 11b. In the embodiment, the first insulating region 12 is a void (an air gap).

At least a portion of the first insulating region 12 is provided between the first portion 11a and the second portion 11b. At least a portion of the second insulating region 13 is provided at the upper end portion of the insulating unit 10 between the first portion 11a and the second portion 11b. In other words, at least a portion of the second insulating region 13 is provided on the first insulating region 12. A portion of the second insulating region 13 may be provided between the first portion 11a and the first insulating region 12 and between the second portion 11b and the first insulating region 12.

For example, the first insulating region 12 is provided around at least a portion of the n⁻-type semiconductor region 2 and at least a portion of the p-type semiconductor region 3 along the X-Y plane. The first insulating region 12 may be provided around only one of the at least a portion of the n⁻-type semiconductor region 2 or the at least a portion of the p-type semiconductor region 3.

A method for manufacturing the semiconductor device 200 according to the second embodiment will now be described with reference to FIG. 17.

Figure 17:
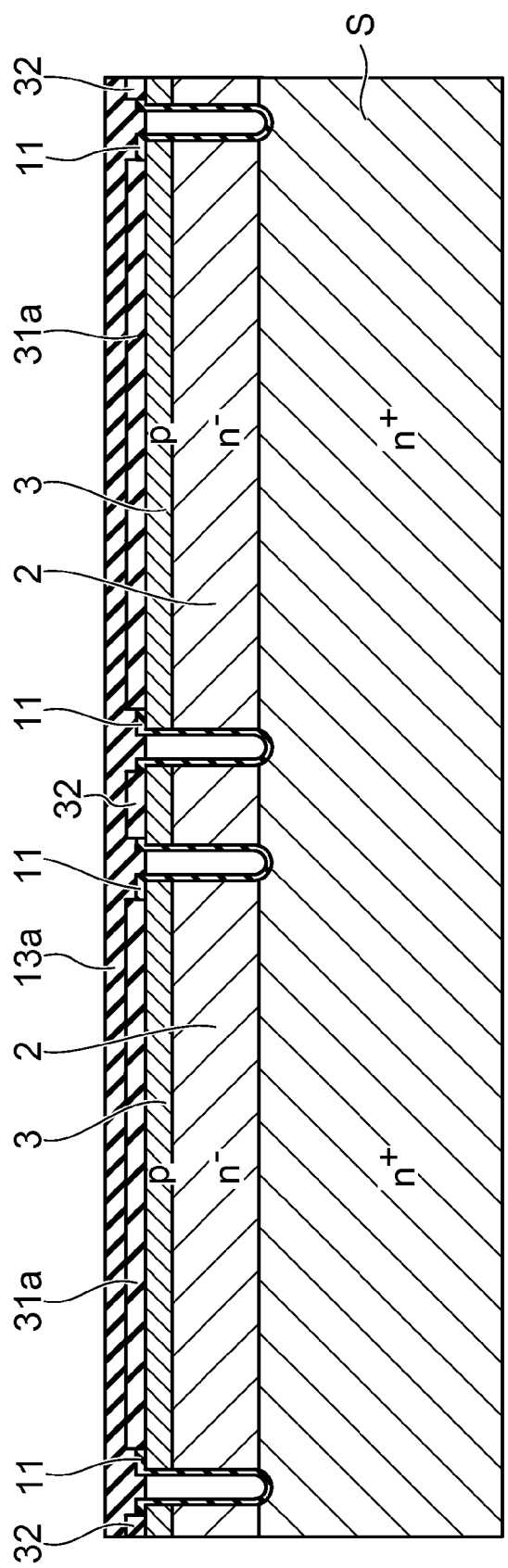
FIG. 17 is a cross-sectional view of a process, showing a manufacturing process of the semiconductor device according to the second embodiment.

FIG. 17 is a cross-sectional view of a process, showing a manufacturing process of the semiconductor device 200 according to the second embodiment.

First, the first insulating layer 11 is formed on the inner wall of the opening OP1 and on a portion of the p-type semiconductor region 3 by performing processes similar to the processes shown in FIG. 4 to FIG. 8. Continuing as shown in FIG. 17, an insulating layer 13a is formed on the first insulating layer 11 and on the insulating layer 31a using CVD (Chemical Vapor Deposition). The insulating layer 13a is, for example, a borophosphosilicate glass (BPSG) layer.

Then, by performing reflow by heating the insulating layer 13a to, for example, 700° C. or more, the BPSG is caused to flow into the opening OP1. By this process, the upper end of the opening OP1 is covered with the BPSG layer; and the first insulating region 12 which is an air gap is made in the space enclosed with the BPSG layer and the first insulating layer 11.

When performing the reflow of the insulating layer 13a, it is desirable for the film thickness (the thickness in the fourth direction) of the first insulating layer 11 to be 0.5 μm or more to suppress the diffusion of boron and phosphorus from the insulating layer 13a into the semiconductor regions.

Continuing, the excessive BGSG layer that is formed on the insulating layer 31a is removed. By this process, the second insulating region 13 shown in FIG. 16 is formed. Subsequently, the semiconductor device 200 is obtained by performing processes similar to the processes shown in FIG. 10 to FIG. 14.

The first insulating region 12 and the second insulating region 13 may be formed by depositing an insulating material so that an air gap occurs in the interior of the opening OP1. At this time, for example, CVD, PVD (Physical Vapor Deposition), etc., may be used.

The relative dielectric constant of the first insulating region 12 which is an air gap has a value near 1.0. Conversely, for example, in the case where the first insulating layer 11 includes silicon oxide, the relative dielectric constant of the first insulating layer 11 is 3.5 to 4.0. In other words, the relative dielectric constant of the first insulating region 12 is less than the relative dielectric constant of the first insulating layer 11.

By the insulating unit 10 including the region having the low relative dielectric constant, the bending at the insulating unit 10 of the equipotential lines that spread from the p-n junction surface of the n⁻-type semiconductor region 2 and the p-type semiconductor region 3 can be suppressed. As a result, the electric field concentration at the end portion of the p-n junction surface between the n⁻-type semiconductor region 2 and the p-type semiconductor region 3 is suppressed; and it is possible to suppress the decrease of the breakdown voltage of the semiconductor device even more.

Third Embodiment

Figure 18:
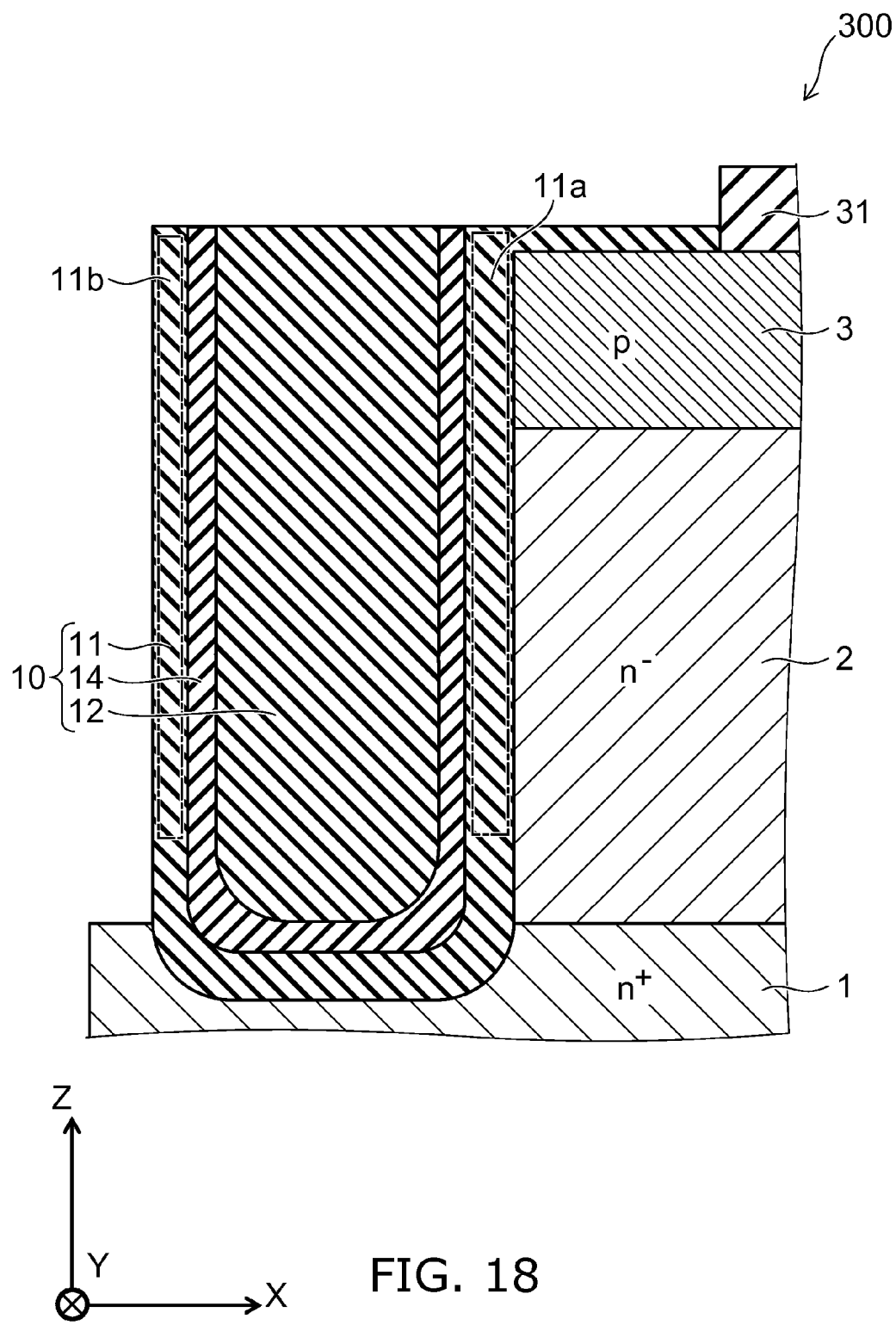
FIG. 18 is a cross-sectional view in which a portion of a semiconductor device according to a third embodiment is enlarged.

FIG. 18 is a cross-sectional view in which a portion of a semiconductor device 300 according to a third embodiment is enlarged.

FIG. 18 is an enlargement of a portion of the X-Z cross section of the semiconductor device 300; and the structure of the Y-Z cross section of the semiconductor device 300 is, for example, the same as the structure shown in FIG. 18.

For example, compared to the semiconductor device 100, the structure of the insulating unit 10 of the semiconductor device 300 is different. Other than the insulating unit 10, a structure similar to that of the semiconductor device 100 is employable as the structure of the semiconductor device 300.

As shown in FIG. 18, the insulating unit 10 includes the first insulating layer 11, the first insulating region 12, and a second insulating layer 14. The first insulating layer 11 includes the first portion 11a and the second portion 11b.

The second insulating layer 14 is provided between the first insulating layer 11 and the first insulating region 12. The material of the second insulating layer 14 has passivation properties superior to those of the material of the first insulating layer 11 and the material of the first insulating region 12.

As an example, the second insulating layer 14 includes a nitride of a semiconductor or a nitride of a metal in the case where the first insulating layer 11 and the first insulating region 12 include an oxide of a semiconductor or an oxide of a metal. For example, the first insulating layer 11 and the first insulating region 12 include silicon oxide; and the second insulating layer 14 includes silicon nitride.

The entire interior of the first insulating layer 11 may be the second insulating layer 14. In other words, the second insulating layer 14 may be provided in the entire region between the first portion 11a and the second portion 11b.

For example, the second insulating layer 14 of the semiconductor device 300 is formed by forming a silicon nitride layer on the first insulating layer 11 using CVD after the process shown in FIG. 8. Subsequently, the first insulating region 12 is formed inside the second insulating layer 14; and the semiconductor device 300 is obtained by performing processes similar to the processes shown in FIG. 10 to FIG. 14.

In the case where an impurity, e.g., water or the like, adheres around the insulating unit 10, such an impurity may enter the interior of the insulating unit 10. If the impurity entering the interior of the insulating unit 10 is polarized by the electric field from the semiconductor device, the distribution of the potential of interior of the semiconductor device may be affected; and the breakdown voltage of the semiconductor device may be reduced.

According to the embodiment, because the insulating unit 10 includes the second insulating layer 14 that has superior passivation properties, the likelihood that the impurities adhered around the insulating unit 10 may enter the interior of the insulating unit 10 can be reduced.

Fourth Embodiment

Figure 19:
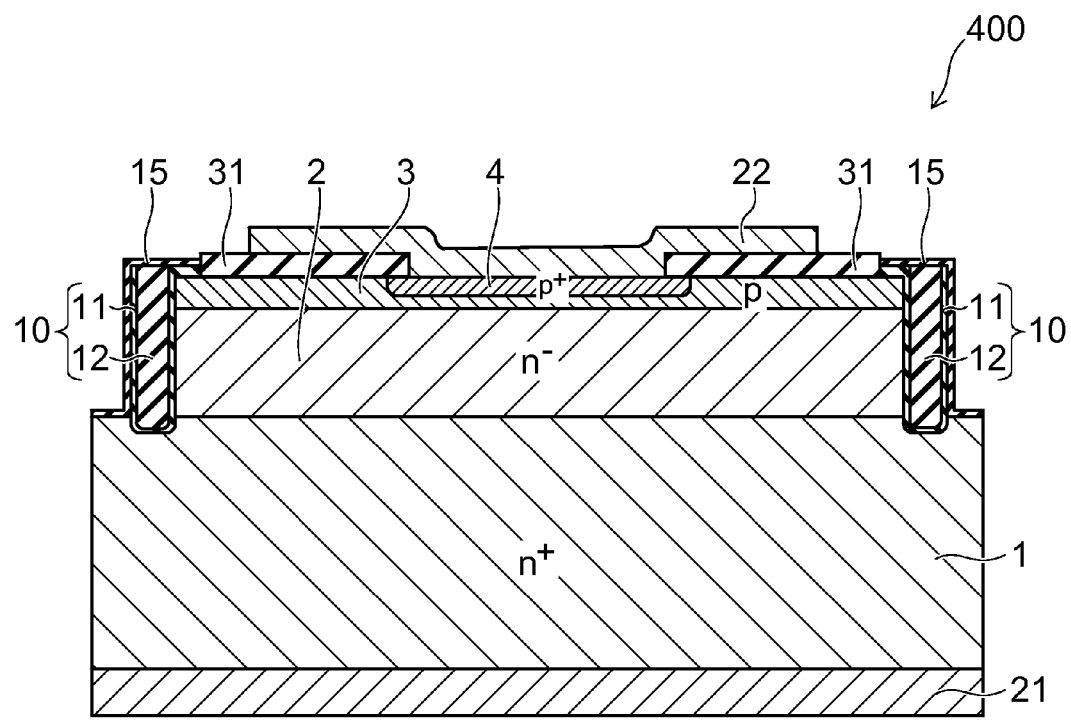
FIG. 19 is a cross-sectional view of a semiconductor device according to a fourth embodiment.
Figure 19:
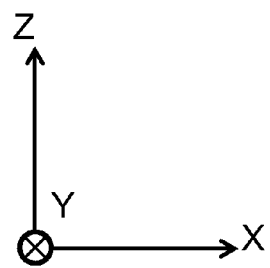

FIG. 19 is a cross-sectional view of a semiconductor device 400 according to a fourth embodiment.

FIG. 19 is the configuration of the X-Z cross section of the semiconductor device 400; and, for example, the structure of the Y-Z cross section of the semiconductor device 400 is the same as the structure of the X-Z cross section shown in FIG. 19.

For example, compared to the semiconductor device 100, the semiconductor device 400 is different in that the semiconductor device 400 further includes an insulating layer 15. Other than the insulating layer 15, for example, a structure similar to that of the semiconductor device 100 is employable as the structure of the semiconductor device 400.

At least a portion of the insulating layer 15 is provided around the insulating unit 10. A portion of the insulating layer 15 may be provided on the insulating unit 10. Similarly to the second insulating layer 14 of the semiconductor device 300, a material having superior passivation properties is used as the material of the insulating layer 15. As an example, the insulating unit 10 includes silicon oxide; and the insulating layer 15 includes silicon nitride.

For example, the semiconductor device 400 is made by the following method.

First, processes similar to the processes shown in FIG. 4 to FIG. 13 are performed; and the opening OP2 is made. Continuing, for example, a silicon nitride layer is formed on the inner wall of the opening OP2 using CVD. Subsequently, the excessive silicon nitride layer that is formed on the anode electrode 22 is removed; and the semiconductor device 400 is obtained by performing a process similar to the process shown in FIG. 14.

According to the embodiment, similarly to the semiconductor device 400, the likelihood that the impurities adhered around the insulating layer 15 may enter the interior of the insulating unit 10 can be reduced.

Fifth Embodiment

Figure 20:
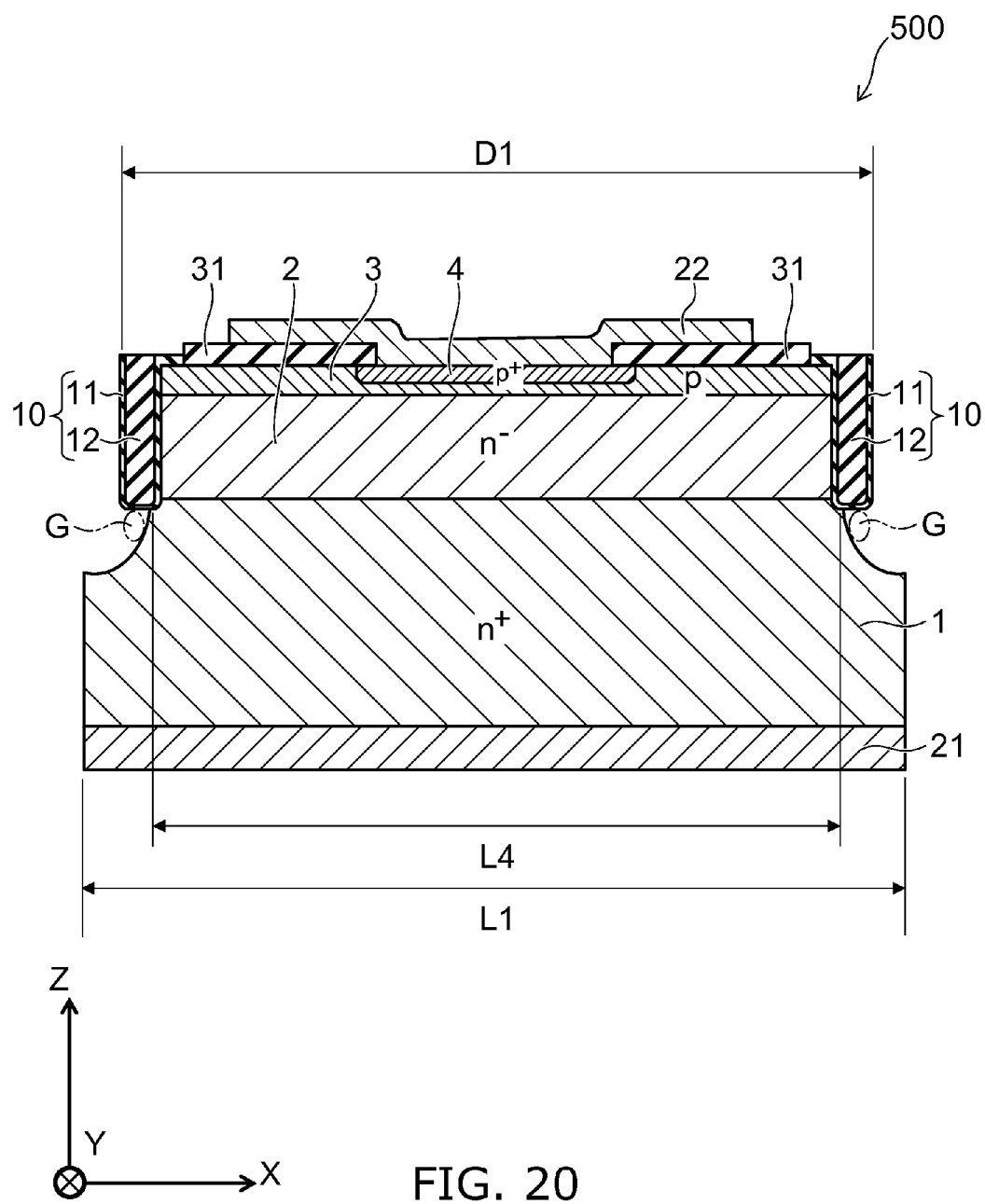
FIG. 20 is a cross-sectional view of a semiconductor device according to a fifth embodiment.

FIG. 20 is a cross-sectional view of a semiconductor device 500 according to a fifth embodiment.

FIG. 20 shows the configuration of the X-Z cross section of the semiconductor device 500. For example, the structure of the Y-Z cross section of the semiconductor device 500 is the same as the structure of the X-Z cross section.

For example, compared to the semiconductor device 100, the configuration of the n⁺-type semiconductor region 1 of the semiconductor device 500 is different. Other than the n⁺-type semiconductor region 1, for example, a structure similar to that of the semiconductor device 100 is employable as the structure of the semiconductor device 500.

In the semiconductor device 500, a gap G is provided between a portion of the n⁺-type semiconductor region 1 and a portion of the insulating unit 10 in the Z-direction. Therefore, a length L4 from one end to the other end in the X-direction of the portion of the n⁺-type semiconductor region 1 contacting the first insulating layer 11 is shorter than the length L1 in the X-direction of the other portion of the n⁺-type semiconductor region 1. The distance D1 from one end to the other end in the X-direction of the first insulating layer 11 is, for example, longer than the length L4 but shorter than the length L1.

The void G may be provided along the entire outer circumferential surface of the upper end portion of the n⁺-type semiconductor region 1 or may be provided only at a portion around the upper end portion of the n⁺-type semiconductor region 1.

Figure 21:
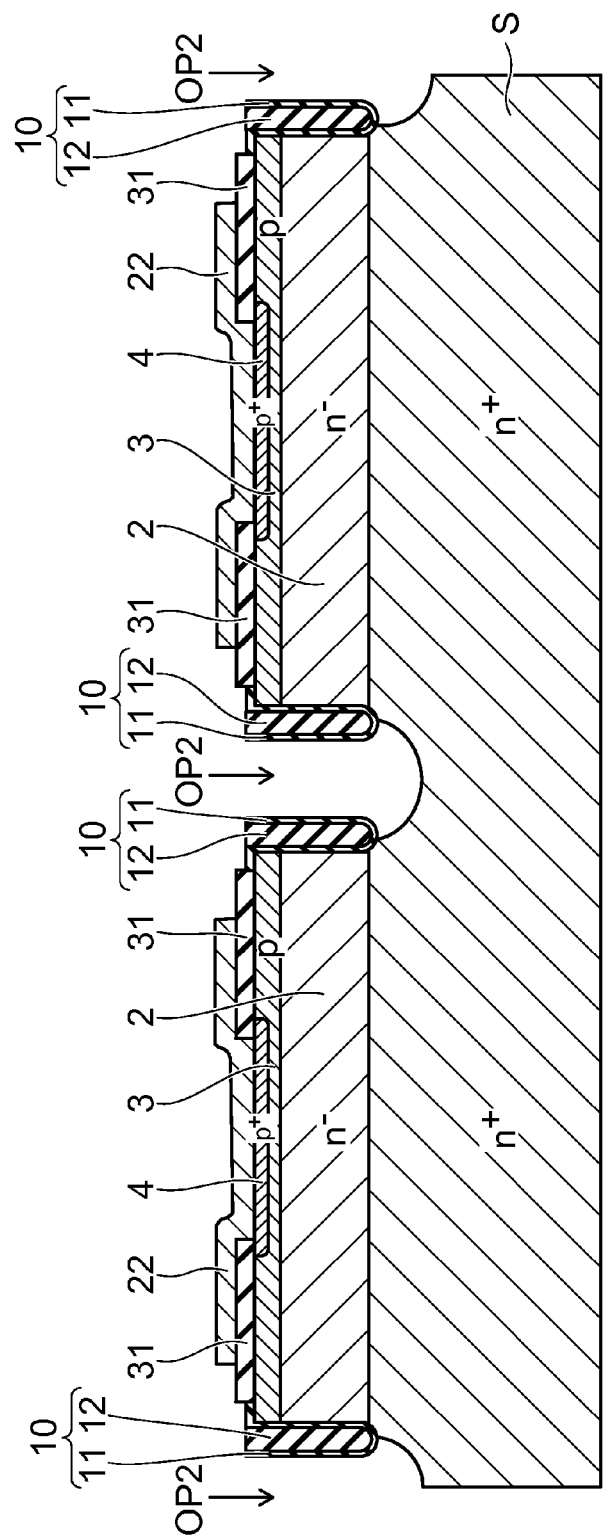
FIG. 21 is a cross-sectional view of a process, showing a manufacturing process of the semiconductor device according to the fifth embodiment.

FIG. 21 is a cross-sectional view of a process, showing a manufacturing process of the semiconductor device 500 according to the fifth embodiment.

For example, the semiconductor device 500 is made by the following method.

First, the insulating unit 10, the p⁺-type semiconductor region 4, and the anode electrode 22 are formed by performing processes similar to the processes shown in FIG. 4 to FIG. 11. At this time, the opening OP1 is made so that the opening OP1 reaches the substrate S.

Then, the opening OP2 is made using RIE. At this time, the opening OP2 is made to reach the substrate S. Continuing, by further performing CDE, the opening OP2 shown in FIG. 21 is made by isotropically etching the exposed portions of the substrate S; and a gap is made between a portion of the substrate S and a portion of the insulating unit 10 in the Z-direction.

Or, it is possible to use a Bosch process. The opening OP2 shown in FIG. 21 is made by increasing the etching amount of the isotropic etching with respect to the deposition amount of the protective film in the state in which the opening OP2 has reached the substrate S.

Subsequently, the semiconductor device 500 is obtained by performing a process similar to the process shown in FIG. 14.

In the embodiment as well, similarly to the first embodiment, it is possible to suppress the decrease of the breakdown voltage of the semiconductor device.

Sixth Embodiment

Figure 22:
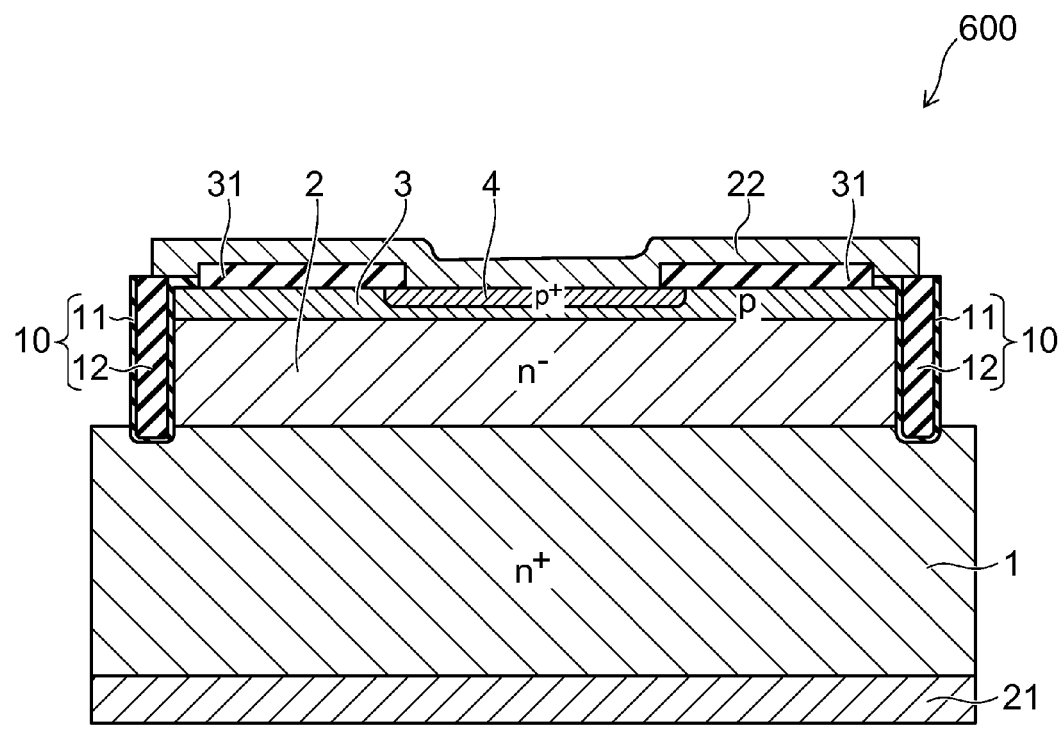
FIG. 22 is a cross-sectional view of a semiconductor device according to a sixth embodiment.
Figure 22:
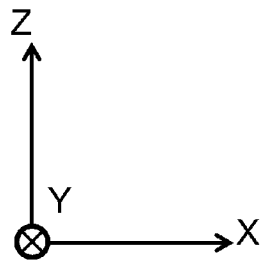

FIG. 22 is a cross-sectional view of a semiconductor device 600 according to a sixth embodiment.

FIG. 22 shows the configuration of the X-Z cross section of the semiconductor device 600. For example, the structure of the Y-Z cross section of the semiconductor device 600 is the same as the structure of the X-Z cross section.

Figure 23:
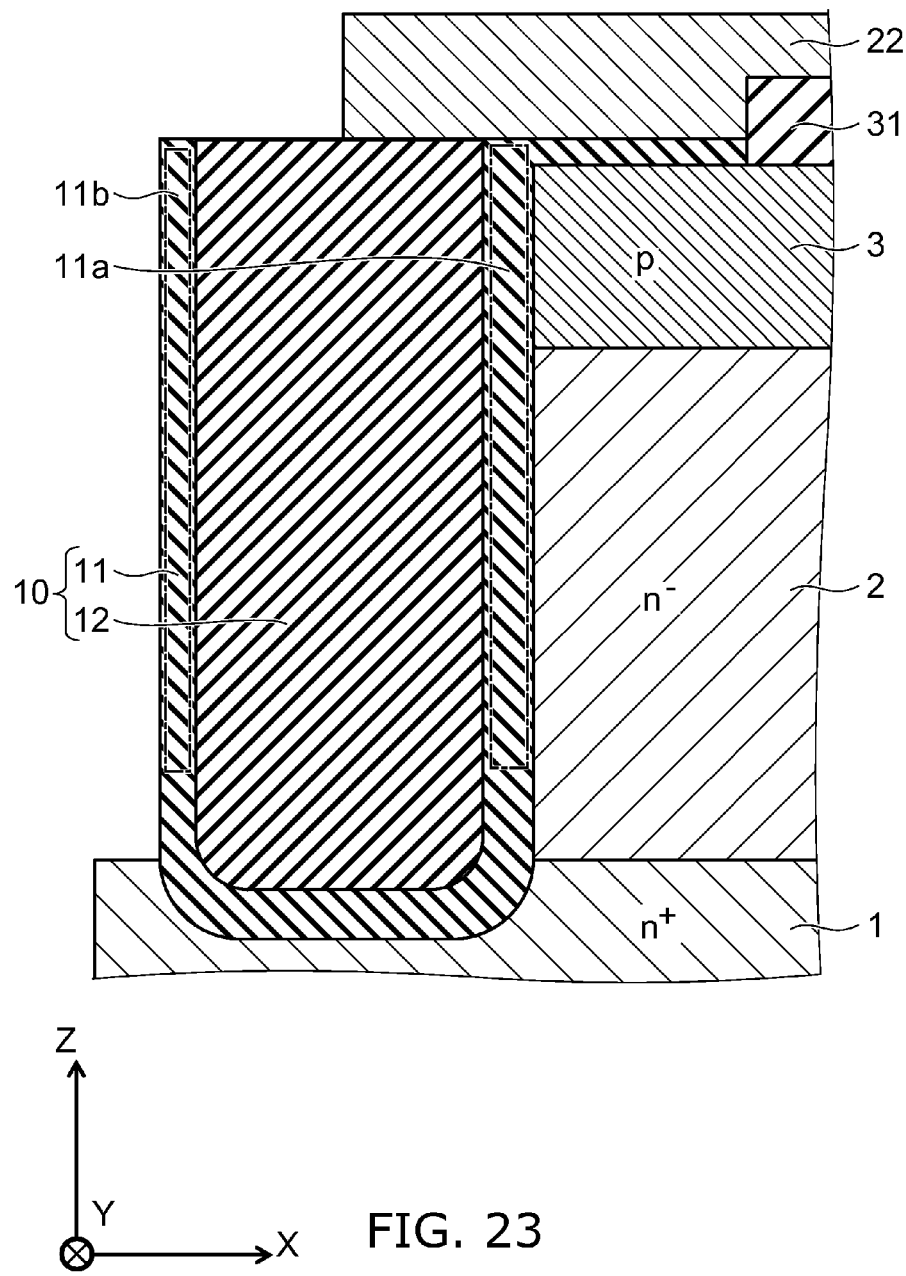
FIG. 23 is a cross-sectional view in which a portion of FIG. 22 is enlarged.

FIG. 23 is a cross-sectional view in which a portion of FIG. 22 is enlarged.

For example, compared to the semiconductor device 100, the semiconductor device 600 is different in that a portion of the anode electrode 22 is provided on the insulating unit 10. Other than the anode electrode 22, for example, a structure similar to that of the semiconductor device 100 is employable as the structure of the semiconductor device 600.

A portion of the anode electrode 22 is provided on the insulating layer 31. Another portion of the anode electrode 22 is provided on the insulating unit 10. The anode electrode 22 and a portion of the n⁺-type semiconductor region 1 overlap in the Z-direction with a portion of the insulating unit 10 interposed.

As an example as shown in FIG. 23, the first portion 11a is provided between the anode electrode 22 and the n⁺-type semiconductor region 1 in the Z-direction. A portion of the first insulating region 12 is provided between the anode electrode 22 and the n⁺-type semiconductor region 1 in the Z-direction.

As in the embodiment, by a portion of the anode electrode 22 being provided on at least a portion of the insulating unit 10, the bending of the equipotential lines spreading along the p-n junction surface between the n⁻-type semiconductor region 2 and the p-type semiconductor region 3 can be suppressed on the anode electrode 22 side of the insulating unit 10. As a result, compared to the case where the portion of the anode electrode 22 is not provided on the insulating unit 10, the electric field concentration at the end portion of the p-n junction surface is suppressed; and the decrease of the breakdown voltage of the semiconductor device can be suppressed even more.

Seventh Embodiment

Figure 24:
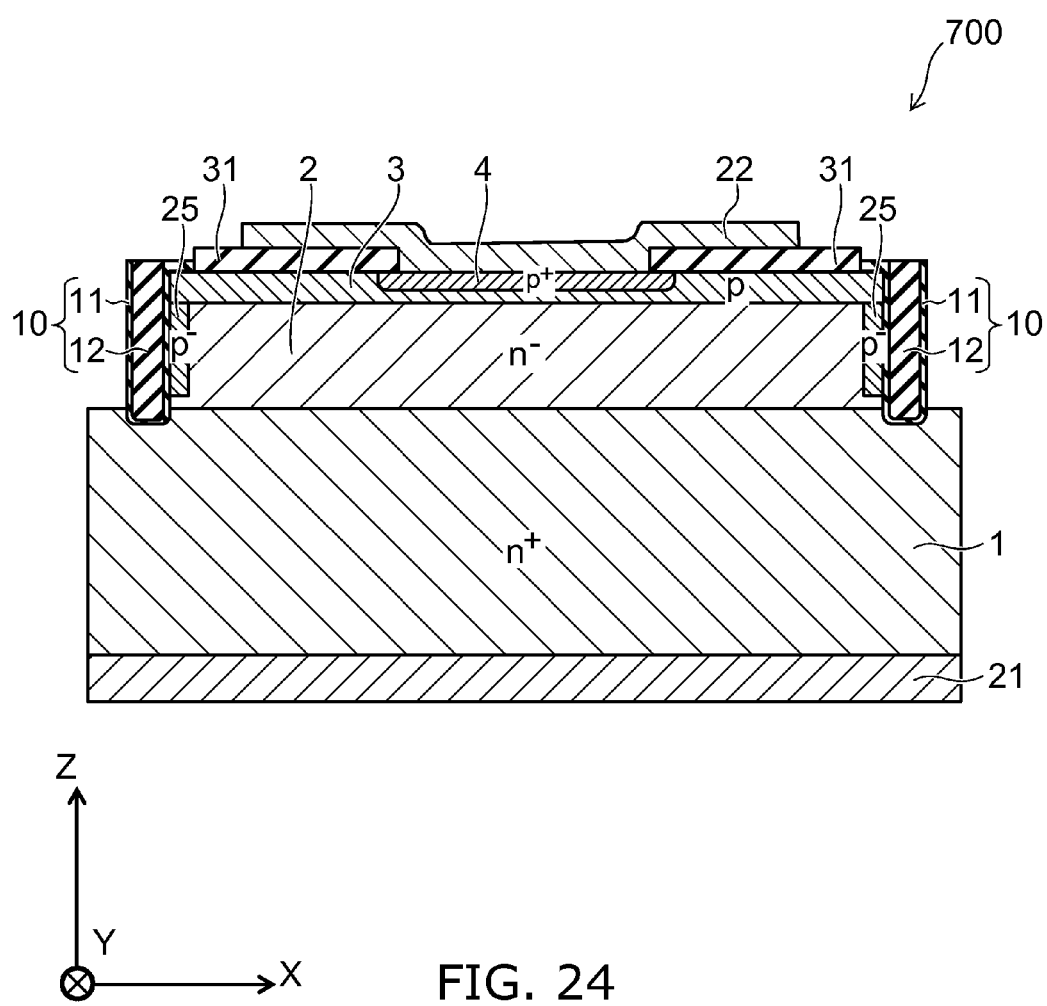
FIG. 24 is a cross-sectional view of a semiconductor device according to a seventh embodiment.

FIG. 24 is a cross-sectional view of a semiconductor device 700 according to a seventh embodiment.

FIG. 24 shows the configuration of the X-Z cross section of the semiconductor device 700. For example, the structure of the Y-Z cross section of the semiconductor device 700 is the same as the structure of the X-Z cross section.

For example, compared to the semiconductor device 100, the semiconductor device 700 is different in that the semiconductor device 700 further includes a p⁻-type semiconductor region 25 (a fourth semiconductor region). Other than the p⁻-type semiconductor region 25, for example, a structure similar to that of the semiconductor device 100 is employable as the structure of the semiconductor device 700.

For example, the p-type impurity concentration of the p⁻-type semiconductor region 25 is lower than the p-type impurity concentration of the p-type semiconductor region 3. However, the p-type impurity concentration of the p⁻-type semiconductor region 25 may be equal to the p-type impurity concentration of the p-type semiconductor region 3.

One Z-direction end of the p⁻-type semiconductor region 25 contacts the p-type semiconductor region 3. For example, the p⁻-type semiconductor region 25 is provided around a portion of the n⁻-type semiconductor region 2. In other words, p-type semiconductor regions are provided to be continuous on the n⁻-type semiconductor region 2 and at the side of the n⁻-type semiconductor region 2.

For example, the impurity concentration and the thickness in the fourth direction of the p⁻-type semiconductor region 25 are set so that the entire p⁻-type semiconductor region 25 is depleted when applying a reverse voltage to the cathode electrode 21 and the anode electrode 22.

The p⁻-type semiconductor region 25 may be provided around the entire n⁻-type semiconductor region 2. In such a case, the other Z-direction end of the p⁻-type semiconductor region 25 contacts the n⁺-type semiconductor region 1; and, for example, the n⁺-type semiconductor region 1 is provided around a portion of the p⁻-type semiconductor region 25. In other words, at least a portion of the p⁻-type semiconductor region 25 is provided between at least a portion of the n⁻-type semiconductor region 2 and a portion of the insulating unit 10 in the X-direction and the Y-direction.

Figure 25:
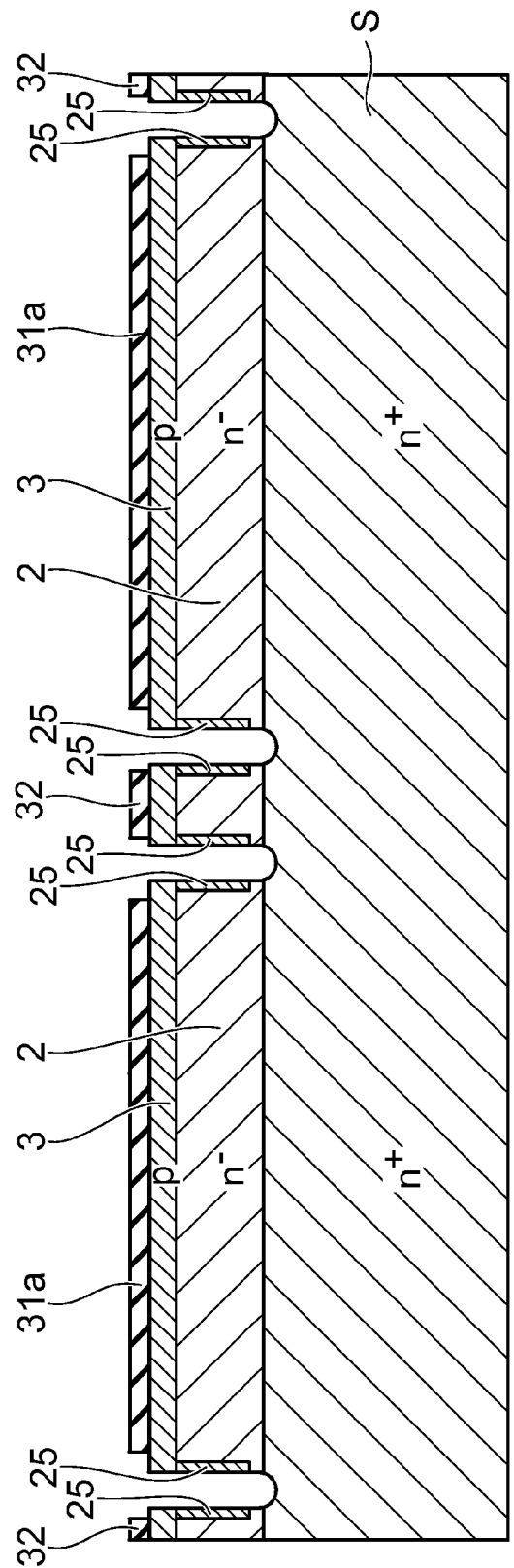
FIG. 25 is a cross-sectional view of a process, showing a manufacturing process of the semiconductor device 700 according to the seventh embodiment.

FIG. 25 is a cross-sectional view of a process, showing a manufacturing process of the semiconductor device 700 according to the seventh embodiment.

For example, the semiconductor device 700 is made by the following manufacturing method.

First, processes similar to the processes shown in FIG. 4 to FIG. 7 are performed; and the opening OP1 is made.

Then, as shown in FIG. 25, ion implantation of a p-type impurity is performed into the exposed portions of the n⁻-type semiconductor region 2 via the opening OP1. By this process, the p⁻-type semiconductor region 25 is formed.

The formation process of the p⁻-type semiconductor region 25 may be performed after making the opening OP1 and forming the first insulating layer 11. However, to efficiently perform the ion implantation of the p-type impurity into the portion of the n⁻-type semiconductor region 2, it is desirable to form the p⁻-type semiconductor region 25 prior to the formation of the first insulating layer 11.

According to the embodiment, because the p⁻-type semiconductor region 25 is provided in contact with the p-type semiconductor region 3, the equipotential lines spread toward the cathode electrode 21 side in the region where the p⁻-type semiconductor region 25 is provided. Therefore, the concentration of the electric field at the end portion of the p-type semiconductor region 3 is suppressed; and it is possible to suppress the decrease of the breakdown voltage of the semiconductor device even more.

Eighth Embodiment

Figure 26:
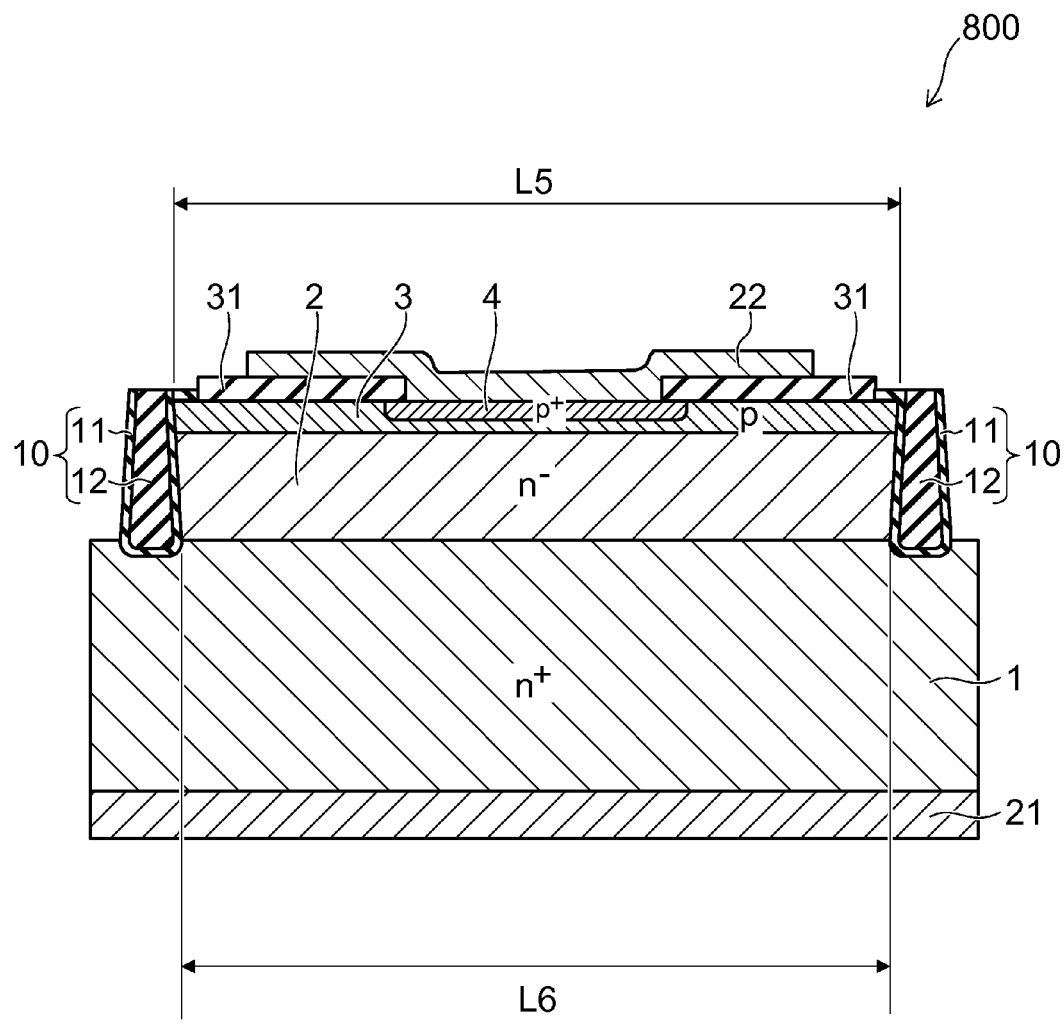
FIG. 26 is a cross-sectional view of a semiconductor device according to an eighth embodiment.

FIG. 26 is a cross-sectional view of a semiconductor device 800 according to an eighth embodiment.

Figure 27:
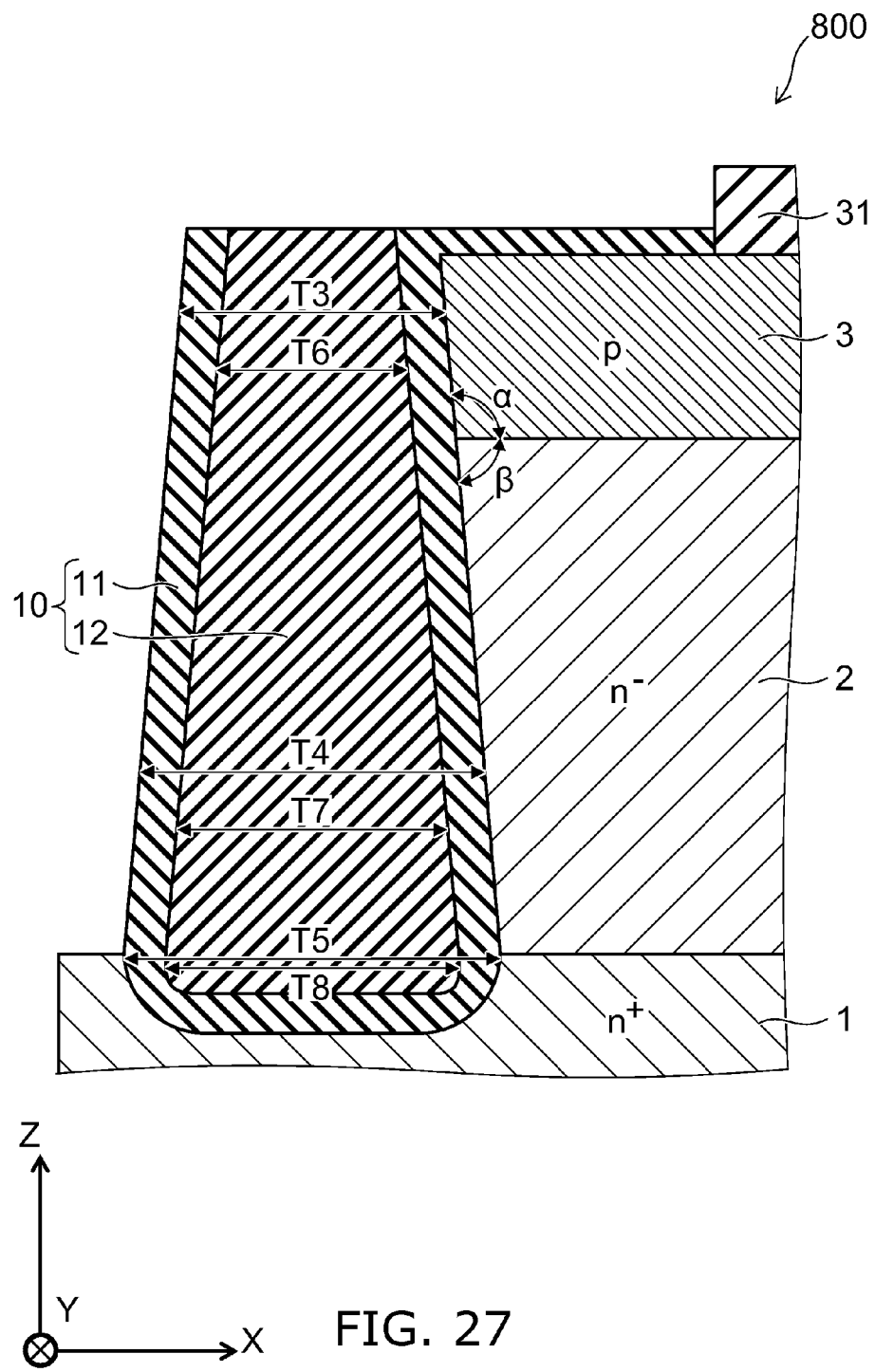
FIG. 27 is a cross-sectional view in which a portion of FIG. 26 is enlarged.

FIG. 27 is a cross-sectional view in which a portion of FIG. 26 is enlarged.

FIG. 26 is the X-Z cross section of the semiconductor device 800; and a structure similar to FIG. 26 may be used as the structure of the Y-Z cross section of the semiconductor device 800 as well.

Compared to the semiconductor device 100, for example, the configurations of the n⁻-type semiconductor region 2, the p-type semiconductor region 3, and the insulating unit 10 of the semiconductor device 800 are different. Other than the insulating unit 10, for example, a structure similar to the semiconductor device 100 is employable as the structure of the semiconductor device 800.

As shown in FIG. 26 and FIG. 27, the width of the insulating unit 10 increases toward the −Z direction. Therefore, for example, the widths of the n⁻-type semiconductor region 2 and the p-type semiconductor region 3 where the insulating unit 10 is provided around the n⁻-type semiconductor region 2 and the p-type semiconductor region 3 decrease toward the −Z direction.

In other words, the length in the X-direction of at least a portion of the n⁻-type semiconductor region 2 is shorter than the length in the X-direction of at least a portion of the p-type semiconductor region 3. Specifically, as shown in FIG. 26, a length L6 in the X-direction of a portion of the n⁻-type semiconductor region 2 is shorter than a length L5 in the X-direction of at least a portion of the p-type semiconductor region 3.

A thickness T4 in the fourth direction of the portion of the insulating unit 10 overlapping the n⁻-type semiconductor region 2 in the X-direction is thicker than a thickness T3 in the fourth direction of the portion of the insulating unit 10 overlapping the p-type semiconductor region 3 in the X-direction. In the case where the insulating unit 10 and the n⁺-type semiconductor region 1 overlap in the X-direction, a thickness T5 in the fourth direction is thicker than the thickness T3 in the fourth direction for the portion of the insulating unit 10 overlapping the n⁺-type semiconductor region 1 in the X-direction.

In the insulating unit 10, for example, the thickness in the fourth direction of the first insulating layer 11 is constant; and the thickness in the fourth direction of the first insulating region 12 changes. In other words, a thickness T7 in the fourth direction of the portion of the first insulating region 12 overlapping the n⁻-type semiconductor region 2 in the X-direction with the first insulating layer 11 interposed is thicker than a thickness T6 in the fourth direction of the portion of the first insulating region 12 overlapping the p-type semiconductor region 3 in the X-direction with the first insulating layer 11 interposed.

In the case where the first insulating region 12 and the n⁺-type semiconductor region 1 overlap with the first insulating layer 11 interposed in the X-direction, a thickness T8 in the fourth direction is longer than the thickness T7 in the fourth direction for the portion of the first insulating region 12 overlapping the n⁺-type semiconductor region 1 in the X-direction with the first insulating layer 11 interposed.

For example, the semiconductor device 800 is made by the following manufacturing method.

First, the insulating layer 31a and the insulating layer 32 are formed by performing processes similar to the processes shown in FIG. 4 and FIG. 5. Continuing, the opening OP1 is made. At this time, for example, the opening OP1 can be made so that the width widens toward the −Z direction by forming the film thickness of the sidewall protective film to be thick and increasing the etching rate of the isotropic etching using a Bosch process.

Subsequently, the semiconductor device 800 shown in FIG. 26 and FIG. 27 is obtained by performing processes similar to the processes shown in FIG. 8 to FIG. 14.

In the embodiment, the thickness of the insulating unit 10 is thicker toward the −Z direction. Therefore, as shown in FIG. 27, an angle α between the contact surface of the p-type semiconductor region 3 and the insulating unit 10 and the p-n junction surface of the n⁻-type semiconductor region 2 and the p-type semiconductor region is greater than 90 degrees.

On the other hand, an angle β between the contact surface of the n⁻-type semiconductor region 2 and the insulating unit 10 and the p-n junction surface of the n⁻-type semiconductor region 2 and the p-type semiconductor region is less than 90 degrees. In other words, the angle is less than 90 degrees between the p-n junction surface and the end surface of the semiconductor region having the lower impurity concentration of the two semiconductor regions forming the p-n junction surface (the contact surface between the n⁻-type semiconductor region 2 and the first insulating layer 11).

There are cases where the depletion layer contracts and the electric field strength becomes high at the end portion vicinity of the p-n junction surface. As in the embodiment, it is possible to weaken the electric field strength at the end surface vicinity by setting the angle β to be less than 90 degrees. Accordingly, according to the embodiment, it is possible to suppress the decrease of the breakdown voltage of the semiconductor device even more.

Ninth Embodiment

Figure 28:
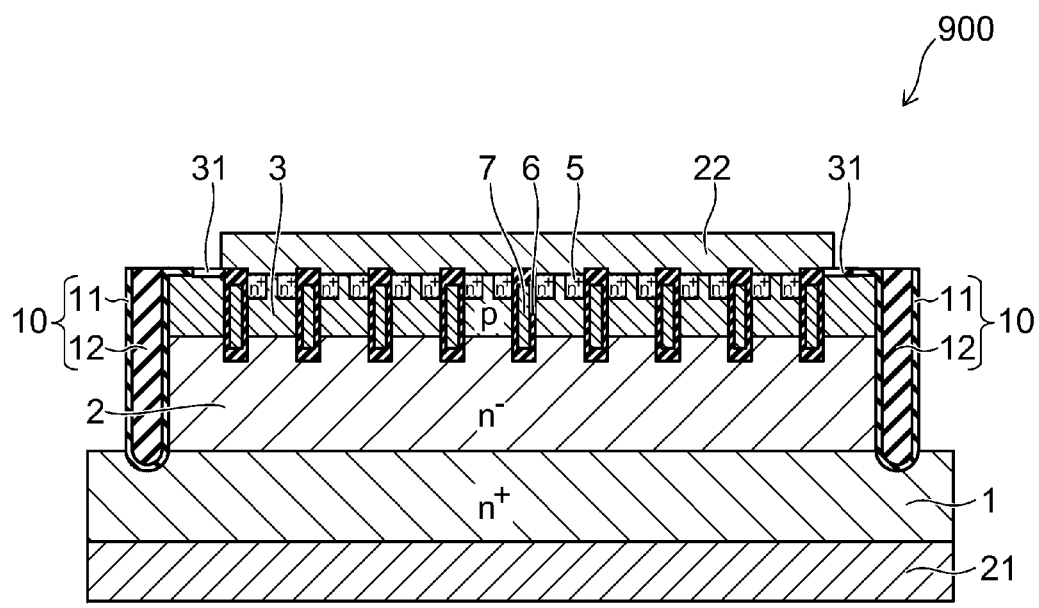
FIG. 28 is a cross-sectional view of a semiconductor device according to a ninth embodiment.
Figure 28:
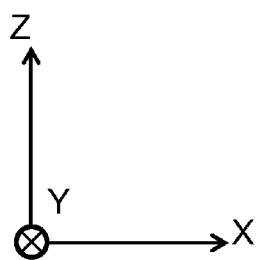

FIG. 28 is a cross-sectional view of a semiconductor device 900 according to a ninth embodiment.

The semiconductor device 900 is, for example, a MOSFET.

The semiconductor device 900 includes an n⁺-type drain region 1 (the third semiconductor region of the first conductivity type), the n⁻-type semiconductor region 2 (the first semiconductor region), a p-type base region 3 (the second semiconductor region of the second conductivity type), an n⁺-type source region 5 (a sixth semiconductor region), a gate insulation layer 6, a gate electrode 7, the first insulating layer 11, the first insulating region 12, a drain electrode 21, a source electrode 22, and the insulating layer 31.

FIG. 28 is the configuration of the X-Z cross section of the semiconductor device 900; and, for example, the structure of the Y-Z cross section of the semiconductor device 900 is the same as the structure of the X-Z cross section shown in FIG. 28.

In the embodiment, for example, structures similar to those of the n⁺-type semiconductor region 1, the n⁻-type semiconductor region 2, the insulating unit 10, the cathode electrode 21, and the anode electrode 22 of any of the first to eighth embodiments are employable as the structures of the n⁺-type drain region 1, the n⁻-type semiconductor region 2, the insulating unit 10, the drain electrode 21, and the source electrode 22. Also, it is possible to employ the structures described in the first to eighth embodiments in combination with each other.

The p-type base region 3 is selectively provided in the n⁻-type semiconductor region 2. The n⁺-type source region 5 is selectively provided on the p-type base region 3. The source electrode 22 is provided on the p-type base region 3 and on the n⁺-type source region 5 and is electrically connected to the n⁺-type source region 5. The insulating unit 10 is provided around the n⁻-type semiconductor region 2 and the p-type base region 3 along the X-Y plane.

For example, the gate electrode 7 overlaps, with the gate insulation layer 6 interposed in the X-direction, a portion of the n⁻-type semiconductor region 2, the p-type base region 3, and at least a portion of the n⁺-type source region 5. The semiconductor device 900 may be a planar-type MOSFET in which the gate electrode 7 overlaps, with the gate insulation layer 6 interposed in the Z-direction, a portion of the n⁻-type semiconductor region 2, the base region 3, and a portion of the n⁺-type source region 5.

The MOSFET is switched to the on-state by applying a voltage not less than the threshold to the gate electrode 7 in the state in which a voltage that is positive with respect to the source electrode 22 is applied to the drain electrode 21. At this time, a channel (an inversion layer) is formed in the region of the gate insulation layer 6 vicinity of the p-type base region 3.

On the other hand, in the case where the voltage that is positive with respect to the source electrode 22 is applied to the drain electrode 21 and the voltage applied to the gate electrode 7 is less than the threshold, the channel is not formed in the region of the gate insulation layer 6 vicinity of the p-type base region 3; and the MOSFET is switched to the off-state. At this time, a depletion layer spreads from the p-n junction interface of the p-type base region 3 and the n⁻-type semiconductor region 2; and the breakdown voltage is maintained.

In the embodiment as well, similarly to the first embodiment, the concentration of the electric field at the end portion of the p-n junction surface can be suppressed; and it is possible to suppress the decrease of the breakdown voltage of the semiconductor device.

Tenth Embodiment

Figure 29:
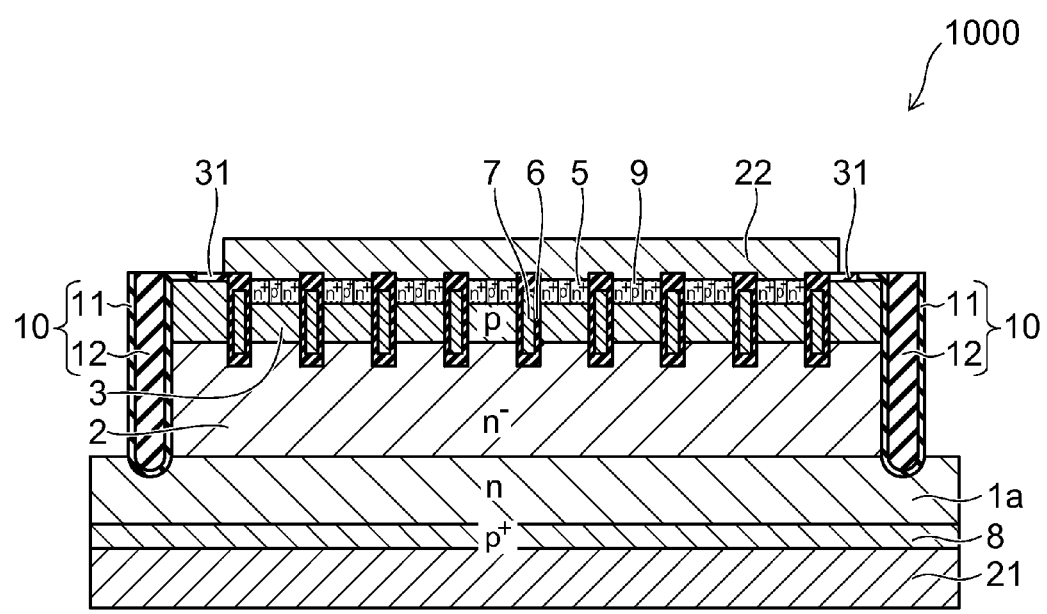
FIG. 29 is a cross-sectional view of a semiconductor device according to a tenth embodiment.

FIG. 29 is a cross-sectional view of a semiconductor device 1000 according to a tenth embodiment.

The semiconductor device 1000 is, for example, an IGBT.

The semiconductor device 1000 includes a p⁺-type collector region 8 (an eighth semiconductor region), an n-type semiconductor region 1a (the third semiconductor region of the first conductivity type), the n⁻-type semiconductor region 2 (the first semiconductor region), the p-type base region 3 (the second semiconductor region of the second conductivity type), an n⁺-type emitter region 5, a p⁺-type contact region 9 (a seventh semiconductor region), the gate insulation layer 6, the gate electrode 7, the first insulating layer 11, the first insulating region 12, a collector electrode 21, an emitter electrode 22, and the insulating layer 31.

FIG. 29 is the configuration of the X-Z cross section of the semiconductor device 1000; and, for example, the structure of the Y-Z cross section of the semiconductor device 1000 is the same as the structure of the X-Z cross section shown in FIG. 29.

The p⁺-type collector region 8 is electrically connected to the collector electrode 21. The n-type semiconductor region 1a is provided on the p⁺-type collector region 8. For example, the n-type semiconductor region 1a is provided on the entire surface of the p⁺-type collector region 8. The n⁻-type semiconductor region 2 is provided on a portion of the n-type semiconductor region 1a. The insulating unit 10 is provided on another portion of the n-type semiconductor region 1a.

The p-type base region 3 is provided on the n⁻-type semiconductor region 2. The n⁺-type emitter region 5 is selectively provided on the p-type base region 3. A structure similar to that of the n⁺-type source region 5 of the ninth embodiment is employable as the structure of the n⁺-type emitter region 5.

The p⁺-type contact region 9 is further provided on the p-type base region 3. For example, the p⁺-type contact region 9 may be provided between the n⁺-type emitter regions 5 in the X-direction. Or, the n⁺-type emitter region 5 and the p⁺-type contact region 9 may be provided alternately in the Y-direction between the gate insulation layers 6 that are adjacent to each other in the X-direction.

For example, the insulating unit 10 is provided around the multiple p⁺-type contact regions 9, the multiple n⁺-type emitter regions 5, the multiple p-type semiconductor regions 3, the n⁻-type semiconductor region 2, and a portion of the n-type semiconductor region 1a along the X-Y plane.

In the embodiment as well, similarly to the first embodiment, the concentration of the electric field at the end portion of the p-n junction surface can be suppressed; and it is possible to suppress the decrease of the breakdown voltage of the semiconductor device.

For example, it is possible to confirm the relative levels of the impurity concentrations of the semiconductor regions in the embodiments described above using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first semiconductor region of a first conductivity type;
    a second semiconductor region of the first conductivity type provided on a portion of the first semiconductor region, an impurity concentration of the first conductivity type of the second semiconductor region being lower than an impurity concentration of the first conductivity type of the first semiconductor region;
    a third semiconductor region of a second conductivity type provided on the second semiconductor region; and
    a first insulating layer provided on another portion of the first semiconductor region, the first insulating layer being provided around the portion of the first semiconductor region, the second semiconductor region, and at least a portion of the third semiconductor region, the first insulating layer contacting the third semiconductor region,
    a length in a second direction of the first semiconductor region being longer than a length in the second direction of the second semiconductor region and being longer than a distance from one end portion in the second direction of the first insulating layer to one other end portion in the second direction of the first insulating layer,
    the second direction being orthogonal to a first direction from the second semiconductor region toward the third semiconductor region,
    any semiconductor region which opposes to the second semiconductor region with the first insulating layer interposed being not provided.

2. The device according to claim 1, further comprising a first insulating region,
    the first insulating layer includes:
        a first portion provided around at least a portion of the second semiconductor region and at least a portion of the third semiconductor region; and
        a second portion provided to be separated from the first portion in the second direction, the second portion being provided around at least a portion of the first portion,
    the first insulating region is provided between the first portion and the second portion.

3. The device according to claim 2, wherein a thickness of the first portion is thicker than a thickness of the second portion.

4. The device according to claim 2, wherein the first insulating region is an air gap.

5. The device according to claim 4, further comprising a second insulating region provided between the first portion and the second portion,
    at least a portion of the second insulating region being provided on the first insulating region,
    the second insulating region including borophosphosilicate glass.

6. The device according to claim 2, wherein a gap is provided between the other portion of the first semiconductor region and a portion of the first insulating layer in the first direction.

7. The device according to claim 2, further comprising a second insulating layer provided around at least a portion of the first insulating layer,
    the second insulating layer including a nitride.

8. The device according to claim 7, wherein
    at least a portion of the second insulating layer is provided between the first insulating layer and the first insulating region, and
    the second insulating layer includes silicon nitride.

9. The device according to claim 2, further comprising a fourth semiconductor region of the second conductivity type provided between at least a portion of the second semiconductor region and at least a portion of the first insulating layer,
    an impurity concentration of the second conductivity type of the fourth semiconductor region is lower than an impurity concentration of the second conductivity type of the third semiconductor region.

10. The device according to claim 2, wherein the length in the second direction of the second semiconductor region is shorter than a length in the second direction of the third semiconductor region.

11. The device according to claim 2, further comprising:
    a sixth semiconductor region of the first conductivity type selectively provided on the third semiconductor region, an impurity concentration of the first conductivity type of the sixth semiconductor region being higher than an impurity concentration of the first conductivity type of the second semiconductor region;

a gate electrode; and a gate insulation layer provided between the gate electrode and the third semiconductor region and between the gate electrode and the sixth semiconductor region.

12. A semiconductor device, comprising:
a first semiconductor region of a first conductivity type;
a second semiconductor region of the first conductivity type provided on a portion of the first semiconductor region, an impurity concentration of the first conductivity type of the second semiconductor region being lower than an impurity concentration of the first conductivity type of the first semiconductor region;
a third semiconductor region of a second conductivity type provided on the second semiconductor region;
a first insulating layer provided on another portion of the first semiconductor region, the first insulating layer being provided around the portion of the first semiconductor region, the second semiconductor region, and at least a portion of the third semiconductor region, the first insulating layer contacting the third semiconductor region, the first insulating layer includes:
   a first portion provided around at least a portion of the second semiconductor region and at least a portion of the third semiconductor region; and
   a second portion provided to be separated from the first portion in a second direction orthogonal to a first direction, the first direction being from the second semiconductor region toward the third semiconductor region, the second portion being provided around at least a portion of the first portion; and
a first insulating region provided between the first portion and the second portion,
   any semiconductor region which opposes to the second semiconductor region with the second portion interposed being not provided.

13. The device according to claim 12, wherein a thickness of the first portion is thicker than a thickness of the second portion.

14. The device according to claim 12, wherein a length in the second direction of the first semiconductor region is longer than a length in the second direction of the second semiconductor region.

15. The device according to claim 12, further comprising a second insulating region provided between the first portion and the second portion,
   the first insulating region being an air gap,
   at least a portion of the second insulating region being provided on the first insulating region,
   the second insulating region including borophosphosilicate glass.

16. The device according to claim 12, wherein a gap is provided between the other portion of the first semiconductor region and a portion of the first insulating layer in the first direction.

17. The device according to claim 12, further comprising a second insulating layer provided around at least a portion of the first insulating layer,
   the second insulating layer including a nitride.

18. The device according to claim 17, wherein
   at least a portion of the second insulating layer is provided between the first insulating layer and the first insulating region, and
   the second insulating layer includes silicon nitride.

19. The device according to claim 12, further comprising a fourth semiconductor region of the second conductivity type provided between at least a portion of the second semiconductor region and at least a portion of the first insulating layer,
   an impurity concentration of the second conductivity type of the fourth semiconductor region is lower than an impurity concentration of the second conductivity type of the third semiconductor region.

20. The device according to claim 12, wherein a length in the second direction of the second semiconductor region is shorter than a length in the second direction of the third semiconductor region.

* * * * *